(12) United States Patent
Yang et al.

(10) Patent No.: US 11,685,015 B2
(45) Date of Patent: Jun. 27, 2023

(54) METHOD AND SYSTEM FOR PERFORMING CHEMICAL MECHANICAL POLISHING

(71) Applicant: TAIWAN SEMICONDUCTOR MANUFACTURING CO., LTD., Hsinchu (TW)

(72) Inventors: Chih-Yuan Yang, Hsinchu (TW); Huai-Tei Yang, Hsinchu (TW); Yu-Chen Wei, New Taipei (TW); Szu-Cheng Wang, Tainan (TW); Li-Hsiang Chao, New Taipei (TW); Jen-Chieh Lai, Tainan (TW); Shih-Ho Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1186 days.

(21) Appl. No.: 16/259,856

(22) Filed: Jan. 28, 2019

(65) Prior Publication Data
US 2020/0238473 A1 Jul. 30, 2020

(51) Int. Cl.
*B24B 37/32* (2012.01)
*B24B 37/10* (2012.01)
*H01L 21/8234* (2006.01)
*H01L 21/304* (2006.01)
*H01L 29/66* (2006.01)
*H01L 29/78* (2006.01)
*H01L 21/321* (2006.01)

(52) U.S. Cl.
CPC ............ *B24B 37/32* (2013.01); *B24B 37/10* (2013.01); *H01L 21/304* (2013.01); *H01L 21/3212* (2013.01); *H01L 21/823431* (2013.01); *H01L 21/823437* (2013.01); *H01L 29/66545* (2013.01); *H01L 29/66795* (2013.01); *H01L 29/7851* (2013.01)

(58) Field of Classification Search
CPC ............... H01L 21/304; H01L 21/3212; H01L 21/823431; H01L 21/823437; H01L 29/66545; H01L 29/66795; H01L 29/7851; B24B 37/32; B24B 37/10
See application file for complete search history.

(56) References Cited

U.S. PATENT DOCUMENTS

| | | | |
|---|---|---|---|
| 6,245,193 B1 * | 6/2001 | Quek | B24B 37/32 451/288 |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,193,027 B2 * | 11/2015 | Loebmann | B24B 7/228 |

(Continued)

*Primary Examiner* — Christine A Enad
(74) *Attorney, Agent, or Firm* — Maschoff Brennan

(57) ABSTRACT

A method of using a polishing system includes securing a wafer in a carrier head, the carrier head including a housing enclosing the wafer, in which the housing includes a retainer ring recess and a retainer ring positioned in the retainer ring recess, the retainer ring surrounding the wafer, in which the retainer ring includes a main body portion and a bottom portion connected to the main body portion, and a bottom surface of the bottom portion includes at least one first engraved region and a first non-engraved region adjacent to the first engraved region; pressing the wafer against a polishing pad; and moving the carrier head or the polishing pad relative to the other.

20 Claims, 33 Drawing Sheets

(56) References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,303 B2 | 1/2017 | Lee et al. | |
| 9,548,366 B1 | 1/2017 | Ho et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,831,183 B2 | 11/2017 | Lin et al. | |
| 9,859,386 B2 | 1/2018 | Ho et al. | |
| 2004/0203325 A1* | 10/2004 | Donohue | B24B 53/017 451/443 |
| 2005/0070210 A1* | 3/2005 | Jeong | B24B 41/005 451/41 |
| 2006/0270325 A1* | 11/2006 | Choi | B24B 37/26 451/285 |
| 2007/0049170 A1* | 3/2007 | Han | B24B 37/32 451/7 |
| 2008/0160885 A1* | 7/2008 | Winterlich | B24B 37/32 451/286 |
| 2017/0182628 A1* | 6/2017 | Lin | B24B 37/30 |
| 2019/0291230 A1* | 9/2019 | Ling | B24B 37/025 |
| 2020/0185231 A1* | 6/2020 | Kim | H01L 21/3212 |

\* cited by examiner

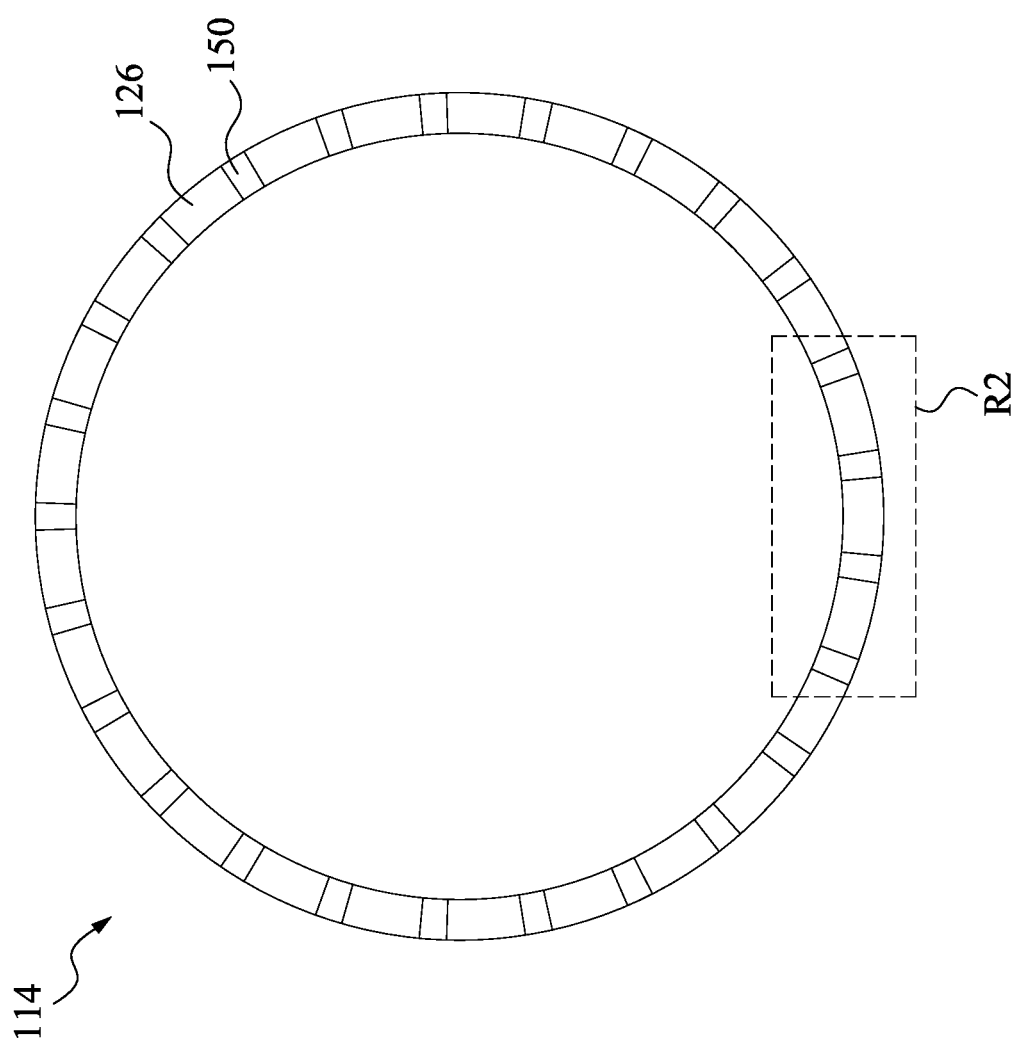

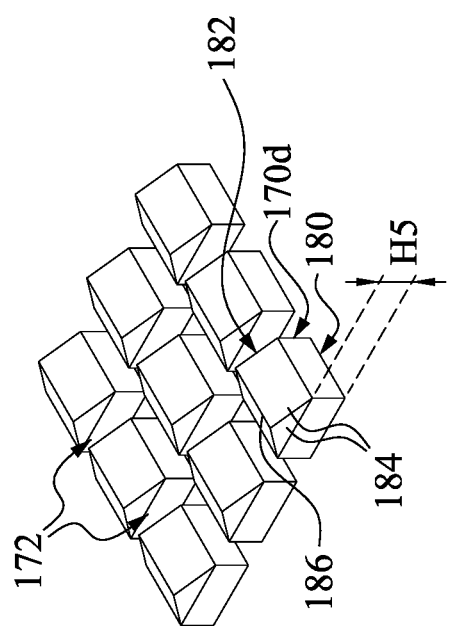

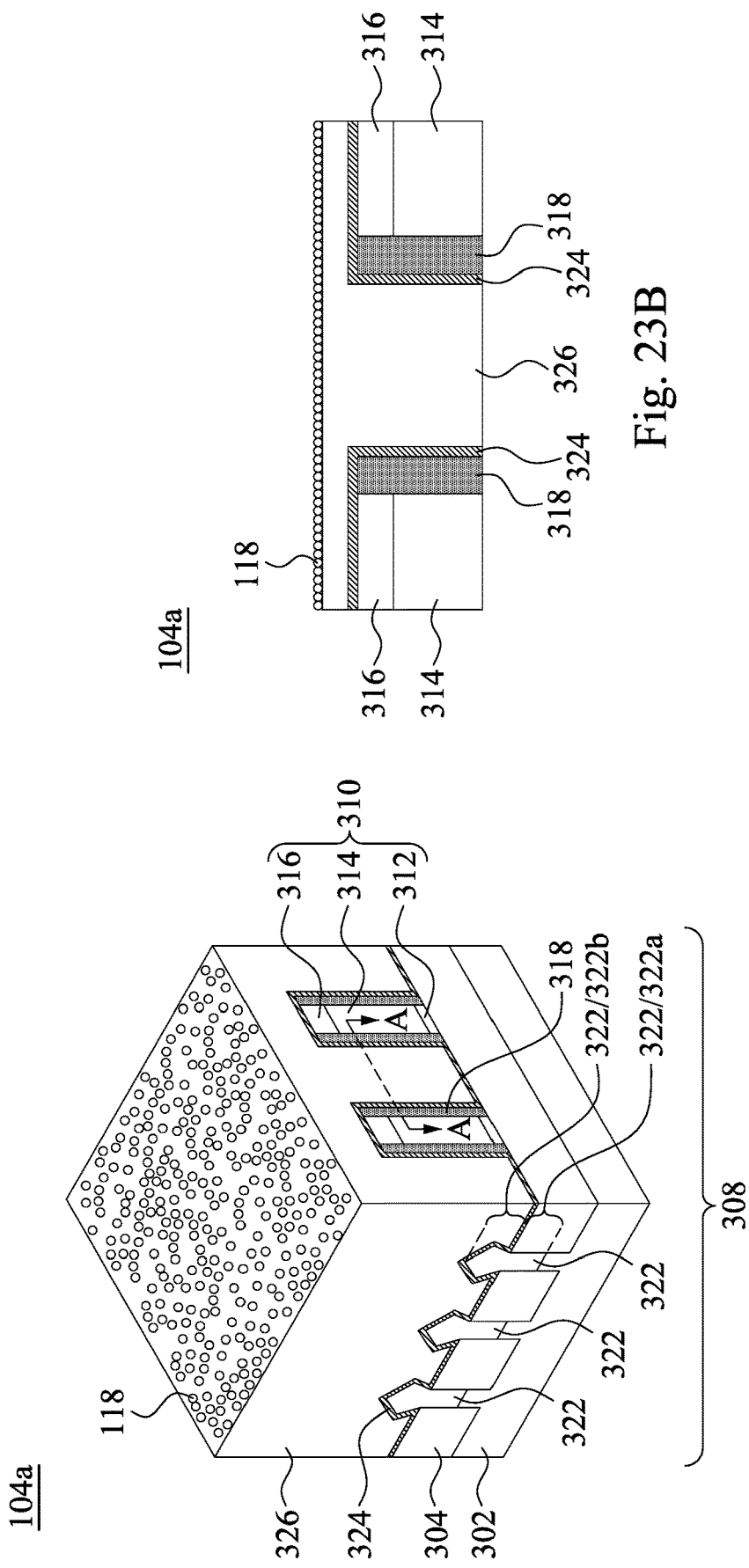

METHOD AND SYSTEM FOR PERFORMING CHEMICAL MECHANICAL POLISHING

BACKGROUND

Integrated circuits may be formed using various photolithographic techniques. Such techniques typically include use of a Chemical Mechanical Polishing (CMP) process, which is performed to polish a surface of a wafer. However, conventional CMP processes may have wafer scratch issues, which can lead to wafer acceptance test failure or low wafer yields.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a bottom view of a retainer ring in accordance with some embodiments.

FIGS. 8A-8E are portions of an engraved region of a bottom portion of the conditioning disk with various geometric shapes in accordance with some embodiments.

FIGS. 19-25 illustrate perspective views and cross-sectional views of intermediate stages in the formation of a Fin Field-Effect Transistors (FinFET) in accordance with some embodiments.

DETAILED DESCRIPTION

Figure 1:
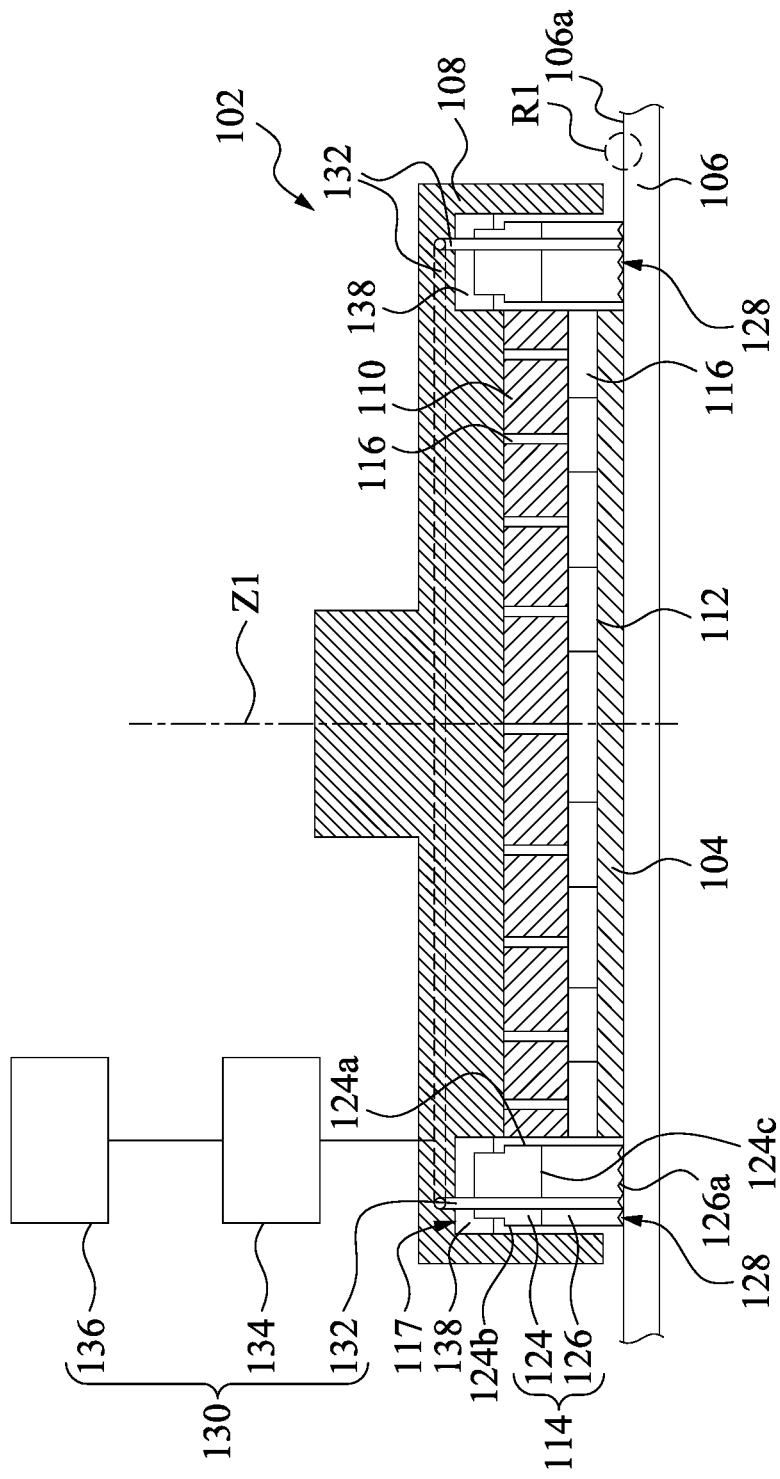
FIG. 1 is a cross-sectional view of a carrier head over a polishing pad in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Chemical Mechanical Polishing (CMP) system is provided in accordance with various exemplary embodiments. The variations of some embodiments are discussed. Throughout the various views and illustrative embodiments, like reference numbers are used to designate like elements. The embodiments of the present disclosure also include the scope of using the CMP system in accordance with the embodiments to manufacture integrated circuits. For Example, the CMP system is used to planarize wafers, in which integrated circuits are formed.

Figure 2:
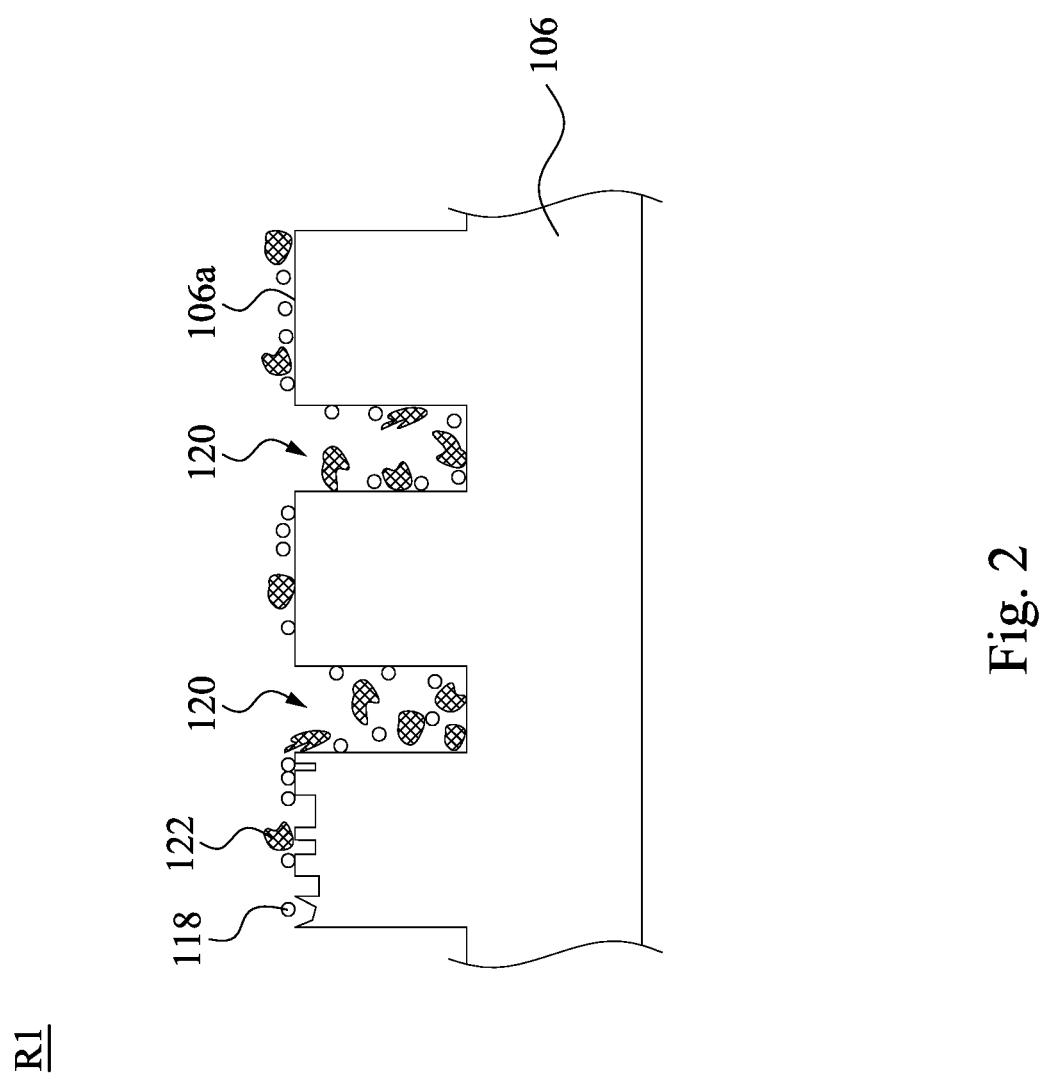
FIG. 2 shows a region R1 in FIG. 1, which is a partially enlarged cross-sectional view of the top surface of the polishing pad in which debris and abrasive particles accumulated thereon, in accordance with some embodiments.

FIG. 1 is a cross-sectional view of a carrier head 104 over a polishing pad 106 in accordance with some embodiments. FIG. 2 shows a region R1 in FIG. 1, which is a partially enlarged cross-sectional view of a top surface 106a of the polishing pad 106 in which debris 122 and by-product residues 118 (e.g., residues of abrasive particles of slurry) resulting from the CMP process accumulated thereon. Reference is made to FIGS. 1 and 2. A carrier head 102 is usable in a polishing system, such as a CMP system 194 and 202 depicted in FIGS. 11-16 vide infra. A wafer 104 is secured in the carrier head 102 and between the carrier head 102 and a polishing pad 106. In some embodiments, the wafer 104 contains active devices. In some embodiments, the wafer 104 contains passive devices. In some embodiments, the wafer 104 is a raw un-processed wafer 104. In some embodiments, the carrier head 102 is configured to move the wafer 104 relative to the polishing pad 106.

The carrier head 102 includes a housing 108, a membrane support 110, a membrane 112, and a retainer ring 114. The housing 108 is configured to enclose a membrane support 110 and the wafer 104 and hold the wafer 104 against the polishing pad 106. The housing 108 is capable of moving in a direction perpendicular to a polishing surface (e.g., a top surface 106a) of polishing pad 106 during the polishing process.

The membrane support 110 has one or more ports defined therein. In some embodiments, the membrane support 110 is solid. In some embodiments, the membrane support 110 is a substantially rigid material, such as a metal, a dielectric material, or another suitable material. The membrane 112 is secured to the membrane support 110 and is configured to press the wafer 104 against the polishing pad 106. The membrane 112 has a lower surface configured to be in contact with the wafer 104. In some embodiments, the membrane 112 and the membrane support 110 form one or more chambers 116. The membrane 112 is used to increase uniformity of the pressure applied to the wafer 104 during the polishing process. Pressures of the chambers 116 are set by fluid or air provided through corresponding ports in order to shape or maintain a predetermined surface profile at the lower surface of the membrane 112. As a result, pressure applied to the wafer 104 is controlled to be evenly distributed throughout the entire wafer 104. In some embodiments, the membrane 112 is formed of a flexible and elastic fluid-impermeable material. In some embodiments, the membrane 112 includes at least one of neoprene, chloroprene, ethylene propylene rubber, silicone, or other suitable flexible materials. In some embodiments, the membrane support 110 is omitted, and the housing 108 directly provides support for the membrane 112.

The housing 108 includes a material having sufficient mechanical strength to withstand the pressure exerted during the polishing process. The housing 108 has a diameter sufficiently large to enclose the wafer 104 and the retainer ring 114 surrounding the wafer 104. The housing 108 includes a retainer ring recess 117 in a periphery region of the housing 108 to accommodate the retainer ring 114. In other words, the retainer ring 114 is positioned in the retainer ring recess 117. In some embodiments, the housing 108 is rotatable in a plane parallel to the polishing surface 106a of the polishing pad 106. In some embodiments, the housing 108 is pivotable about an axis Z1 perpendicular to the polishing surface 106a of the polishing pad 106.

The polishing pad 106 is used to remove materials from the wafer 104. In some embodiments, during a polishing process, the retainer ring 114 and the wafer 104 are in contact with the polishing pad 106. In some embodiments, a slurry (e.g., a slurry 198 shown in FIG. 11) is dispensed on the polishing pad 106 during the polishing process. The slurry may include a chemical solution (such as surfactant or wetting agent) and a plurality of abrasive particles in the chemical solution. In some embodiments, the polishing pad 106 is movable relative to the wafer 104. In some embodiments, the top surface 106a of the polishing pad 106 is a grooved surface (see FIG. 2) and includes grooves 120, whereby the grooved surface is configured to face a to-be polished surface of the wafer 104. Such a grooved surface may advantageously provide a variety of functions such as, for example, preventing a hydroplaning effect between the polishing pad 106 and the wafer 104, acting as drain channels for removing polishing debris 122, and ensuring dispensed slurry to be uniformly distributed across the polishing pad 106, etc.

It is not uncommon to have polishing debris 122 remaining on the top surface 106a of the polishing pad 106 during or after a polishing process. Such debris 122 may be formed due to a variety of reasons such as, for example, debris 122 that is polished out from the wafer 104 and not drained through the grooves 120. As illustrated, the debris 122 and by-product residues 118 (e.g., residues of abrasive particles of slurry) may block the dispensed slurry from going into the groove 120. As a results, the debris 122 and the abrasive particles 118 are generally considered as defects to the wafer 104 since the debris 122 may induce removal rate (RR) vibration due to insufficient slurry utilization and may cause dishing (e.g., the pattern loading effect) and defects (e.g., surface scratches, residues, etc). Conventionally, such debris 122 (defect) is removed offline and manually, which means that the debris 122 is usually identified by a user/administrator of the polishing pad 106 after one or more polishing processes, and then a conditioning device (e.g., a conditioning disk) may be used to remove the debris 122 though the user/administrator applying a downward force.

The retainer ring 114 is configured to reduce lateral movement of the wafer 104 with respect to the carrier head 102 during the polishing process. The retainer ring 114 includes a main body portion 124 and a bottom portion 126 connected to the main body portion 124. In some embodiments, the main body portion 124 has a continuous annular shape. The retainer ring 114 is attached to the retainer ring recess 117 through the main body portion 124 of the retainer ring 114. The main body portion 124 includes an inner periphery 124a configured to surround the wafer 104, an outer periphery 124b, and a bottom surface 124c connecting the inner periphery 124a and the outer periphery 124b. The bottom portion 126 is attached to the bottom surface 124c of the main body portion 124. The bottom portion 126 has at least one engraved region 128 (see FIGS. 4A, 4B, and 5) formed on a bottom surface 126a of the bottom portion 126 facing the polishing pad 106 using an ultra-precision machining method, for example, a method using a laser processing apparatus or a superfine processing machine. The bottom portion 126 further includes a non-engraved region 129 (see FIGS. 4A, 4B, and 5) adjacent to and surrounding the engraved region 128. The non-engraved region 129 is a substantially flat region. Flatness of the non-engraved region 129 is greater than flatness of the engraved region 128. Stated differently, roughness of the engraved region 128 is greater than roughness of the non-engraved region 129. The engraved region 128 of the bottom portion 126 of the retainer ring 114 can help dislodge the debris 122 and the abrasive particles 118 trapped in the polishing pad 106 when the polishing pad 106 and the carrier head 102 are operated to polish the wafer 104 at a predetermined removal rate to refresh the top surface 106a of the polishing pad 106. In other words, the polishing pad 106 can polish the wafer 104, while simultaneously being reconditioned by the engraved region 128 of the bottom portion 126 of the retainer ring 114. In some embodiments, the engraved region 128 of the bottom portion 126 of the retainer ring 114 contacts the top surface 106a of the polishing pad 106 when the polishing pad 106 is to be conditioned. During the conditioning, both the polishing pad 106 and the retainer ring 114 rotate, so that the engraved region 128 of the bottom portion 126 of the retainer ring 114 moves relatively to the top surface 106a of the polishing pad 106, and hence polishing and re-texturizing the top surface 106a of the polishing pad 106. As a result, the polishing pad 106 is conditioned and capable of holding dispensed slurry. Therefore, the wafer 104 can be effectively polished and the polishing pad 106 can be reconditioned in real-time during polishing the wafer 104 without disposing a conditioning disk, which can be costly, thereby saving production cost and time.

In some embodiments, a first vacuum system 130 is coupled to the carrier head 102. The first vacuum system 130 includes a first vacuum port 132, e.g., a plurality of first vacuum holes 152 disposed on the non-engraved region 129 of the bottom portion 126 of the retainer ring 114 (see FIGS. 4A, 4B, and 5). The first vacuum port 132 is connected to a first vacuum pump 134. The first vacuum pump 134 is controlled by a controller, such as a first controller 136. The first vacuum system 130 is configured to apply vacuum suction force through the first vacuum port 132 to the top surface 106a of the polishing pad 106 in a direction away from the top surface 106a to remove materials (e.g., debris 122, abrasive particles 118, etc.) on the top surface 106a of the polishing pad 106.

In operation, the first vacuum port 132 can be placed above a selected location on the polishing pad 106 or in direct contact with the polishing pad 106 at the location. The first vacuum pump 134 is turned on such that the first vacuum system 130 applies suction with a pressure in a direction away from the top surface 106a of the polishing pad 106. In other words, the pressure in a space between the first vacuum port 132 and the top surface 106a of the polishing pad 106 is lower than the atmospheric pressure in which the polishing system is situated. As a result, materials, such as polishing detritus including debris 122, abrasive particles 118, and cleaning fluid, on the top surface 106a of the polishing pad 106 and in the space between the first vacuum port 132 and the top surface 106a of the polishing pad 106 are drawn into the first vacuum system 130. In some embodiments, the main body portion 124 and the bottom portion 126 of the retainer ring 114 include substantially the same material, for example, non-diamond material, such as high strength thermosetting polymer (e.g., poly-ether ketone (PEEK), polyaryletherketone (PAEK), polytetrafluoroethylene (PTFE), polyphenylene sulfide (PPS), etc.), metal, ceramic, the like, or combinations thereof. Therefore, conditioning the polishing pad 106 using such engraved region 128 may help save production cost.

The carrier head 102 further includes one or more cushion members 138 in the retainer ring recess 117, as shown in FIG. 1. The one or more cushion members 138 are configured to press the retainer ring 114 against the polishing pad 106 and to adjust position of the retainer ring 114 by adjusting corresponding pressures of the cushion members 138. In some embodiments, the cushion members 138 each include a flexible element enclosing the chamber 116 for containing a fluid. In some embodiments, the cushion members 138 include a flexible solid material. In some embodiments, the cushion members 138 are omitted, and the retainer ring 114 is directly attached to the retainer ring recess 117.

FIG. 3 illustrates a bottom view of the retainer ring shown in FIG. 1 in accordance with some embodiments. A plurality of grooves 150 are formed in a bottom surface of the bottom portion 126 of the retainer ring 114. The grooves 150 create openings extending from an outer perimeter of the retainer ring 114 to the wafer 104, thus facilitating a flow (e.g., allowing for the even distribution) of the slurry over the wafer 104. It is contemplated in other embodiments to have grooves with different dimensions.

Figure 4A:
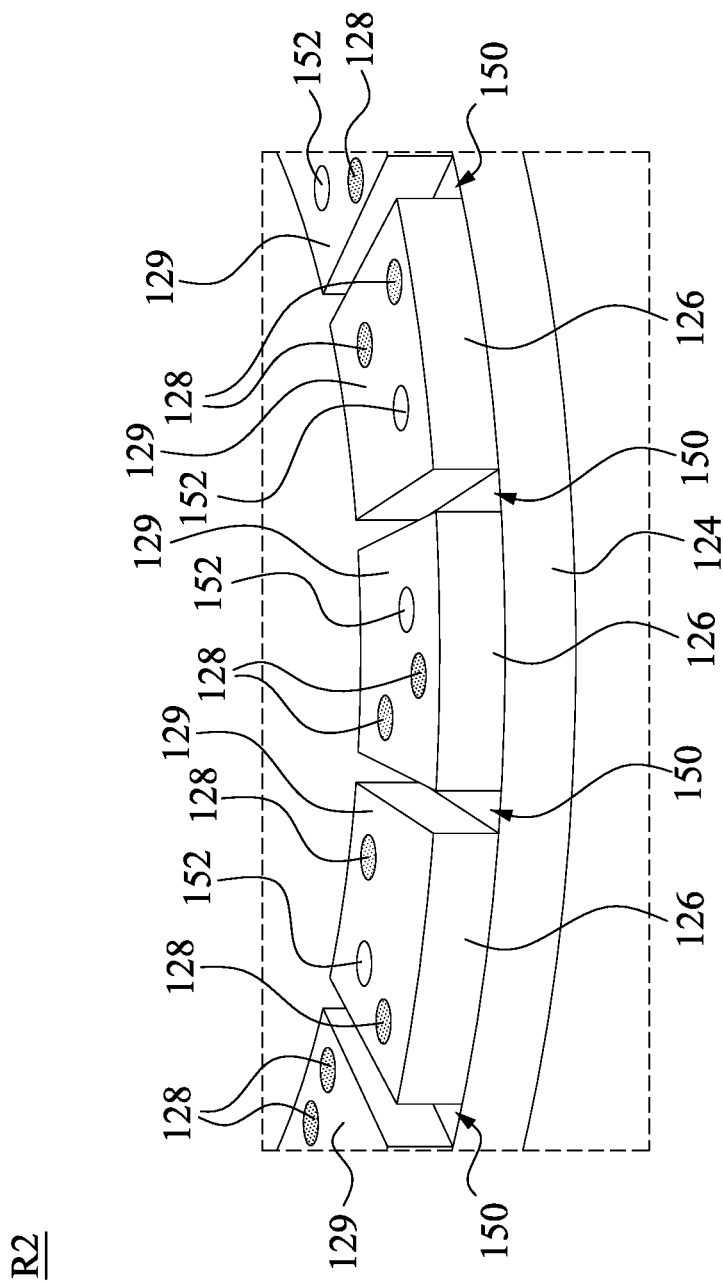
FIG. 4A shows a region R2 in FIG. 3, which is a partially enlarged cross-sectional view of the retainer ring, in accordance with some embodiments.

FIG. 4A shows a region R2 in FIG. 3, which is a partially enlarged cross-sectional view of the retainer ring 114, in accordance with some embodiments. The bottom portion 126 of the retainer ring 114 includes at least one engraved region 128 and a non-engraved region 129 adjacent to and surrounding the engraved region 128. In other words, the engraved region 128 and the non-engraved region 129 combine to form the bottom surface 126a of the bottom portion 126 of the retainer ring 114. The bottom portion 126 of the retainer ring 114 further includes at least one first vacuum hole 152 formed on the non-engraved region 129 of the bottom portion 126 of the retainer ring 114. The engraved region 128 and the first vacuum hole 152 may be arranged randomly on the bottom portion 126. As compared to a carrier head 102 without the first vacuum system 130, the conditioning process with the first vacuum system 130 can be performed more efficiently and the throughput of the process can be improved; and the wafer 104 polished by the engraved region 128 of the bottom portion 126 of the retainer ring 114 can have reduced defects caused by the polishing detritus remaining on the top surface 106a of the polishing pad 106 after the conditioning.

Figure 4B:
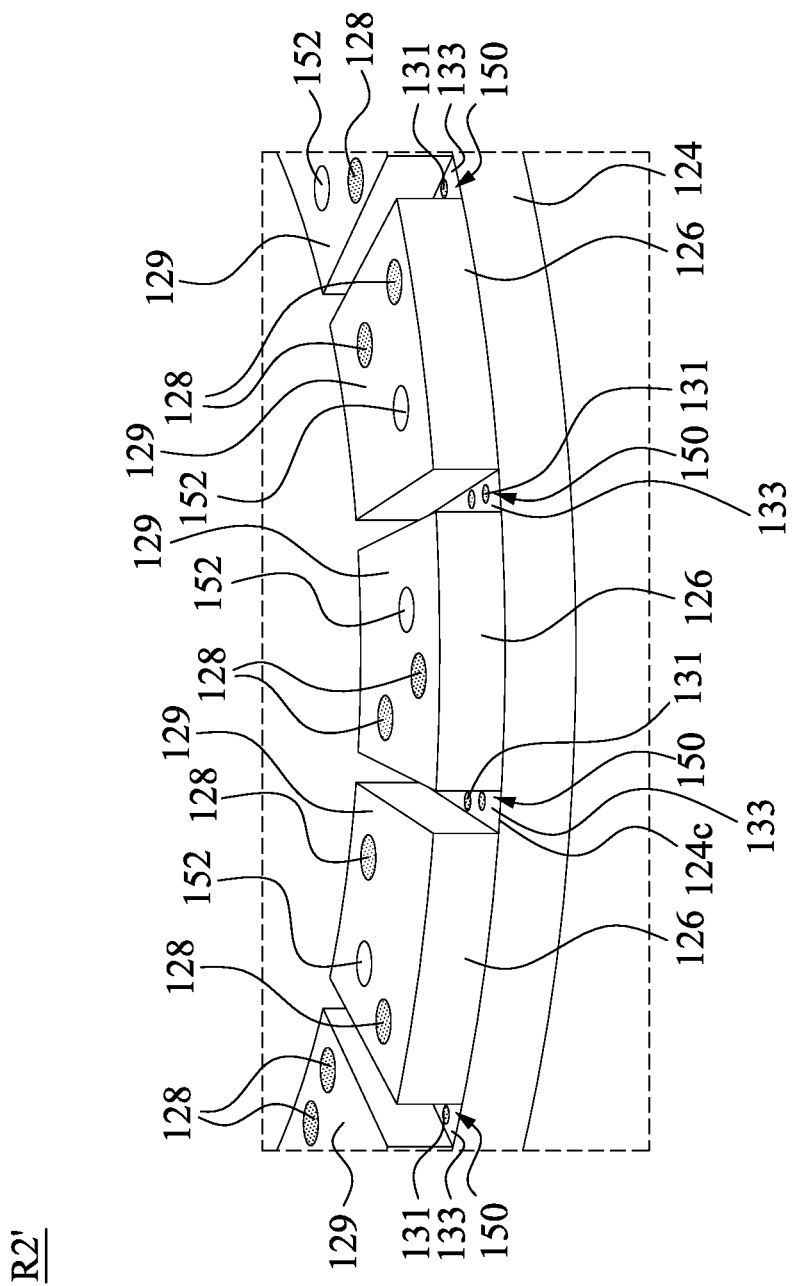
FIG. 4B shows a region R2' similar to the region R2 in FIG. 3, which is a partially enlarged cross-sectional view of the retainer ring, in accordance with some other embodiments.

FIG. 4B shows a region R2' similar to the region R2 in FIG. 4A, except for a second engraved region 131 formed on the bottom surface 124c of the main body portion 124 exposed by and between the grooves 150 in accordance with some other embodiments. The bottom surface 124c of the main body portion 124 includes a second non-engraved region 133 adjacent to and surrounding the second engraved region 131. The second engraved regions 131 can also help dislodge the debris 122 trapped in the polishing pad 106 to refresh the top surface 106a of the polishing pad 106. However, it is understood that the number of the first vacuum hole 152 is only for illustration purposes and are not limiting.

Figure 5:
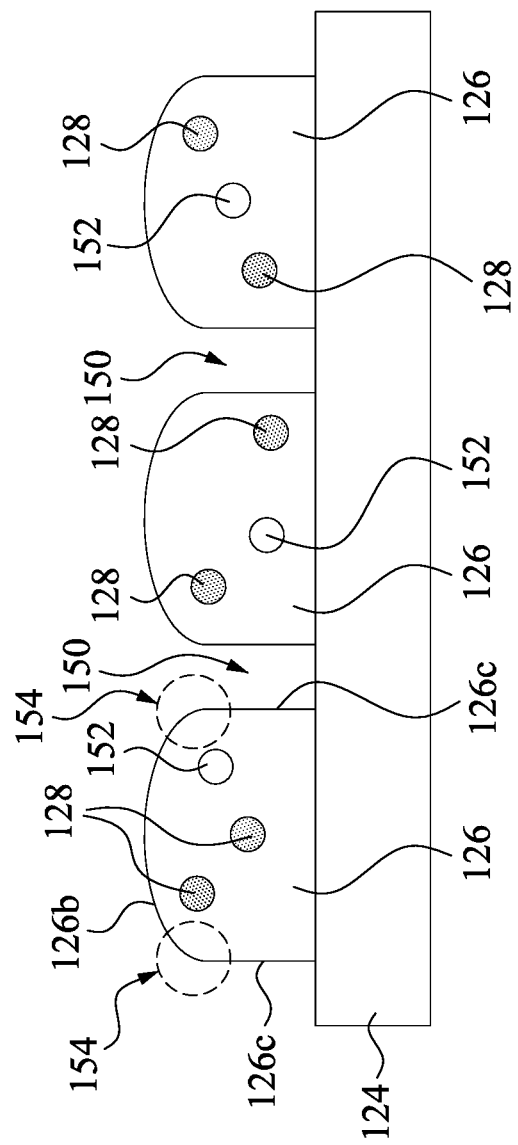
FIG. 5 is a partially enlarged cross-sectional view of the retainer ring shown in FIG. 3 in accordance with some other embodiments.

FIG. 5 is a partially enlarged cross-sectional view of the retainer ring 114 shown in FIG. 3. In some embodiments, chamfers 154 are formed at a top surface 126b and a side surface 126c of the bottom portion 126. In other words, the bottom portion 126 has at least one rounded corner (e.g., the chamfer 154). The chamfers 154 are used for enhancing conditioning the polishing pad 106, for example, removing the accumulated debris 122, abrasive particles 118, and byproducts during the CMP polishing process and also making the top surface 106a of the polishing pad 106 rough.

Figure 6B:
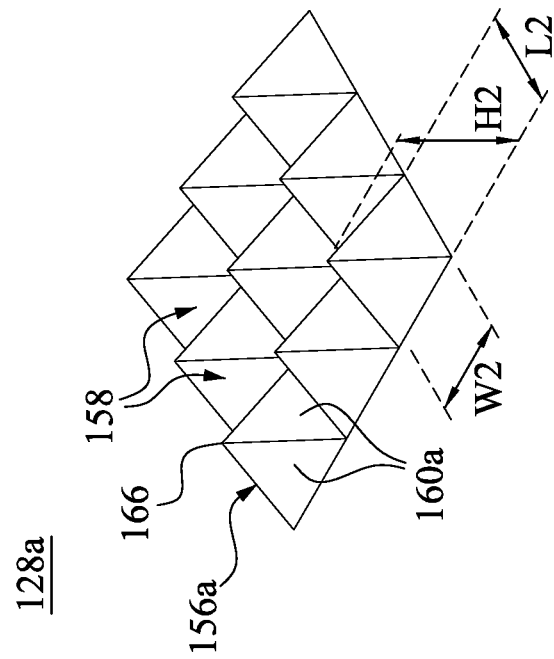
FIGS. 6A-6D are portions of an engraved region of a bottom portion of the retainer ring with various geometric shapes in accordance with some embodiments.
Figure 6A:
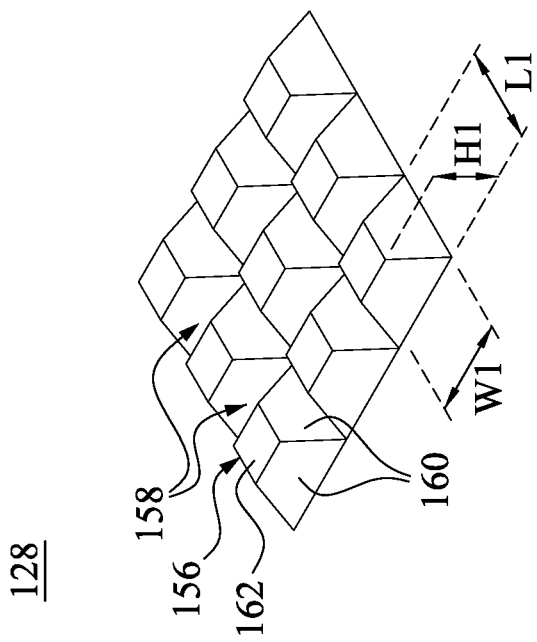
Figure 6D:
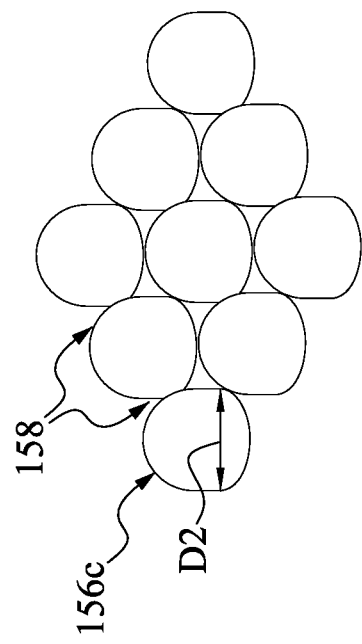
Figure 6C:
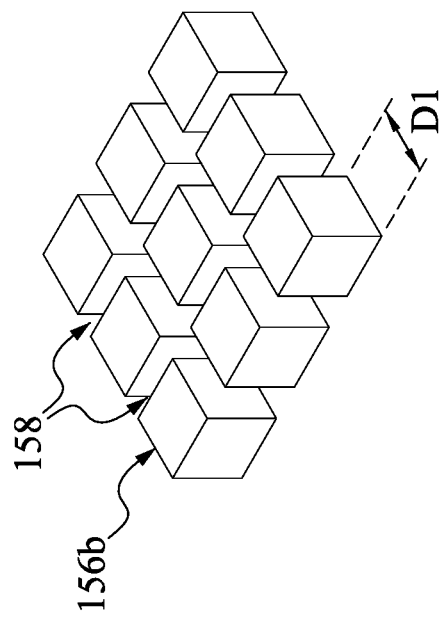

FIGS. 6A-6D illustrate the engraved region of the bottom portion of the retainer ring with various geometric shapes of FIG. 1 in accordance with some embodiments. Reference is made to FIG. 6A. The engraved region 128 has multiple pyramid-shaped protrusions 156 and grooves 158 cut into or formed in the bottom surface 126a of the bottom portion 126. Each protrusion 156 has four sides 160 and a plateau 162. A network of the intersecting perpendicular grooves 158 separate adjacent protrusions 156 from each other. Each protrusion 156 may have a dimension of a length L1×width W1×height H1 of from about 0.2×0.2×0.2 (mm) to about 10×10×1 (mm) in some embodiments. The protrusions 156 are equally spaced apart from the grooves 158. FIG. 6B shows an engraved region 128a with another kind of geometric shape similar to the engraved region 128, except for each protrusion 156a includes four sides 160a which meet at an apex 166. Each protrusion 156a may have a dimension of a length L2×width W2×height H2 of from about 0.2×0.2×0.2 (mm) to about 10×10×1 (mm) in some embodiments. Reference is made to FIG. 6C. FIG. 6C shows an engraved region 128b with another kind of geometric shape similar to the engraved region 128, except for each protrusion 156b may be cube-shaped in some embodiments. Each protrusion 156b may have a dimension D1 in a range from about 0.2 mm to about 10 mm in some embodiments. Reference is made to FIG. 6D. FIG. 6D shows an engraved region 128c with another kind of geometric shape similar to the engraved region 128, except for each protrusion 156c may be cylinder-shaped in some embodiments. Each protrusion 156c has a diameter D2 in a range from about 0.2 mm to about 10 mm in some embodiments. If the dimensions of the abovementioned protrusions 156-156c are out of the above-selected ranges, the abrasive particles 118 and the debris 122 may not be effectively removed from the polishing pad 106. In some embodiments, the dimensions of the abovementioned protrusions 156-156c are less than a width of the retainer ring 114. In some embodiments, the protrusions 156-156c and the non-engraved region 129 (see FIGS. 4A, 4B, and 5), which is a substantially flat region, are monolithic. In other words, the protrusions 156-156c and the non-engraved region 129 (see FIGS. 4A, 4B, and 5), which is a substantially flat region, are one-piece formed.

Figure 7:
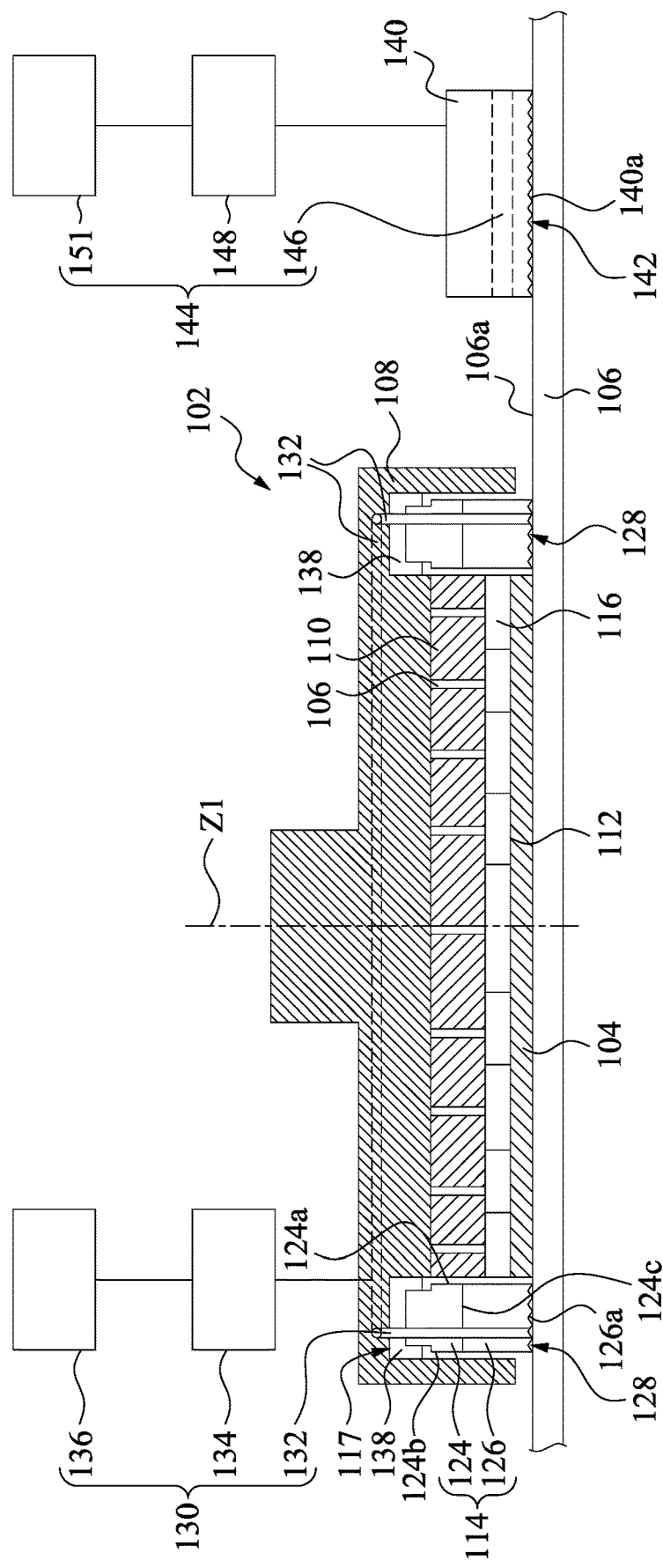
FIG. 7 is a cross-sectional view of a carrier head and a conditioning disk over a polishing pad in accordance with some embodiments.

FIG. 7 is a cross-sectional view of a carrier head and a conditioning disk over a polishing pad in accordance with some embodiments. A conditioning disk 140 is placed on the top surface 106a of the polishing pad 106 in some other embodiments. The conditioning disk 140 includes at least one engraved region 142 disposed on a bottom surface 140a of the conditioning disk 140 facing the top surface 106a of the polishing pad 106. The engraved region 142 of the conditioning disk 140 may be formed using an ultra-precision machining method, for example, a method using a laser processing apparatus or a superfine processing machine. The conditioning disk 140 further includes a non-engraved region 143 (see FIGS. 9A-9C) disposed on the bottom surface 140a of the conditioning disk 140 which is adjacent to the engraved region 142 in some embodiments. In other words, the non-engraved region 143 is a substantially flat region. Flatness of the non-engraved region 143 is greater than flatness of the engraved region 142. Stated differently, roughness of the engraved region 142 is greater than roughness of the non-engraved region 143. The engraved region 142 and the non-engraved region 143 combine to form the bottom surface 140a of the conditioning disk 140. The engraved region 142 of the conditioning disk 140 can help dislodge the debris 122 and the abrasive particles 118 trapped in the polishing pad 106 to refresh the top surface 106a of the polishing pad 106. As a result, the polishing pad 106 is conditioned and capable of holding newly provided slurry.

A second vacuum system 144 is coupled to the conditioning disk 140. The second vacuum system 144 includes a second vacuum port 146, e.g., a plurality of holes formed in the side of the conditioning disk 140 (see FIGS. 9A-9C). The second vacuum port 146 is connected to a second vacuum pump 148. The second vacuum pump 148 is controlled by a controller, such as a second controller 151. The second vacuum system 144 is configured to apply suction through the second vacuum port 146 to the top surface 106a of the polishing pad 106 in a direction away from the top surface 106a to draw removable materials (e.g., debris 122, abrasive particles 118, etc.) from the top surface 106a of the polishing pad 106.

In operation, the second vacuum port 146 can be placed above a selected location on the polishing pad 106 or in direct contact with the polishing pad 106 at the location. The second vacuum pump 148 is run such that the second vacuum system 144 applies vacuum suction force with a pressure in a direction away from the top surface 106a of the polishing pad 106. In other words, the pressure in a space between the second vacuum port 146 and the top surface 106a of the polishing pad 106 is lower than the atmospheric pressure in which the polishing system is situated. As a result, materials, such as polishing detritus including debris 122, abrasive particles 118, and cleaning fluid, on the top surface 106a of the polishing pad 106 and in the space between the second vacuum port 146 and the top surface 106a of the polishing pad 106 are drawn into the second vacuum system 144.

In some embodiments, the engraved region 142 of the conditioning disk 140 contacts the top surface 106a of the polishing pad 106 when the polishing pad 106 is to be conditioned. During the conditioning, both the polishing pad 106 and the conditioning disk 140 rotate, so that the engraved region 142 of the conditioning disk 140 moves relatively to the top surface 106a of the polishing pad 106, and hence polishing and re-texturizing the top surface 106a of the polishing pad 106. As a result, the polishing pad 106 is conditioned and capable of holding newly provided slurry.

In some embodiments, the non-engraved region 143 and the engraved region 142 of the conditioning disk 140 include substantially the same material, for example, non-diamond material, such as high strength thermosetting polymer (e.g., poly-ether ketone (PEEK), polyaryletherketone (PAEK), polytetrafluoroethylene (PTFE), polyphenylene sulfide (PPS), etc.), metal, ceramic, the like, or combinations thereof. Since such conditioning disk 140 may be costly compared to a diamond material, production cost is saved.

The present disclosure provides various embodiments of systems and methods to avoid the above-identified issue by providing an in-situ (during polishing) conditioning the polishing pad 106. The in-situ conditioning may be implemented through the engraved region 128 on the bottom portion 126 of the retainer ring 114 facing the polishing pad 106 coupled to the first vacuum system 130 and the engraved regions 142 formed on the bottom surface 140a of the conditioning disk 140 coupled to the second vacuum system 144, which will be described in the following discussion.

Figure 8B:
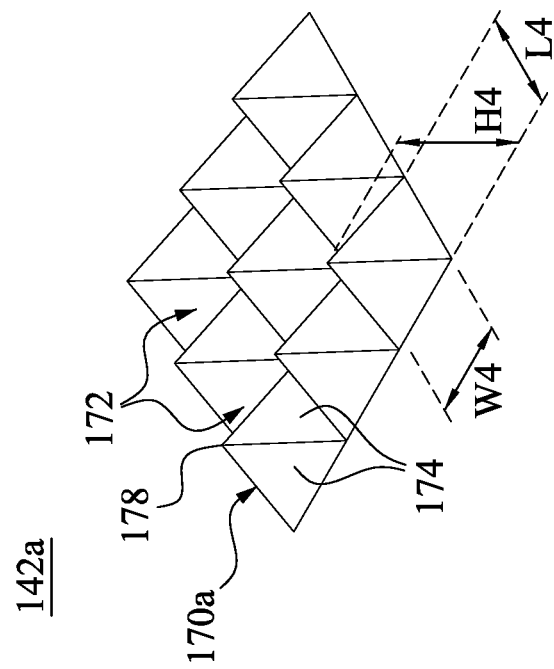
Figure 8A:
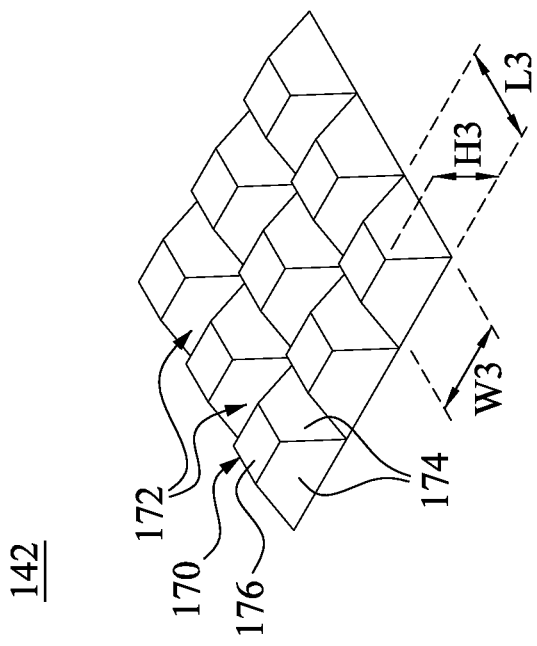
Figure 8D:
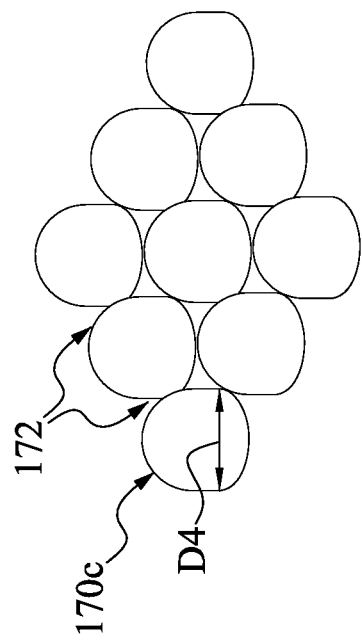
Figure 8C:
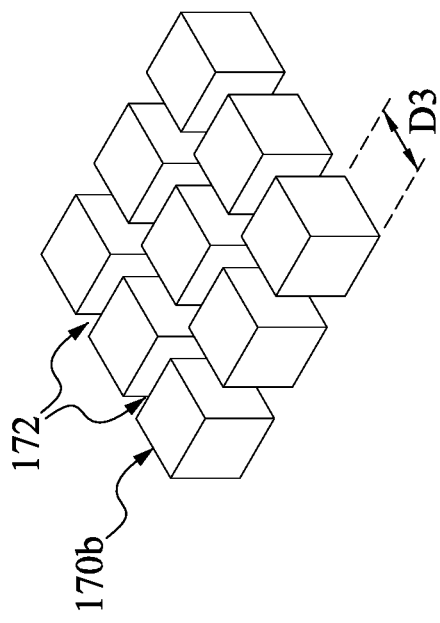

FIGS. 8A-8E illustrate engraved regions on the bottom surface of the conditioning disk with various geometric shapes of FIG. 7 in accordance with some embodiments. Reference is made to FIG. 8A. The engraved region 142 has multiple pyramid-shaped protrusions 170 and grooves 172 cut into or formed in the bottom surface 140a of the conditioning disk 140. Each protrusion 170 has four sides 174 and a plateau 176. A network of the intersecting perpendicular grooves 172 separate adjacent protrusions 170 from each other. Each protrusion 170 may have a dimension of a length L3×width W3×height H3 of from about 0.2× 0.2×0.2 (mm) to about 10×10×1 (mm) in some embodiments. FIG. 8B shows an engraved region 142a with another kind of geometric shape similar to the engraved region 142 of the conditioning disk 140 of FIG. 8A, except for each protrusion 170a includes four sides 174a which meet at an apex 178. Each protrusion 170a may have a dimension of a length L4×width W4×height H4 of from about 0.2×0.2×0.2 (mm) to about 10×10×1 (mm) in some embodiments. Reference is made to FIG. 8C. FIG. 8C shows an engraved region 142b with another kind of geometric shape similar to the engraved region 128, except for each protrusion 170b may be cube-shaped in some embodiments. Each protrusion may have a dimension D3 in a range from about 0.2 mm to about 10 mm in some embodiments. Reference is made to FIG. 8D. FIG. 8D shows an engraved region 142c with another kind of geometric shape similar to the engraved region 142, except for each protrusion 170c may be cylinder-shaped in some embodiments. Each cylinder-shaped protrusion has a diameter D4 in a range from about 0.2 mm to about 10 mm. Reference is made to FIG. 8E. FIG. 8E shows an engraved region 142d with another kind of geometric shape similar to the engraved region 128, except for the each protrusion 170d has a lower portion 180 with a uniform height H5 in a range from about 0.2 mm to about 10 mm and an upper portion 182 with four sides 184 which meet at an apex 186. If the dimensions of the abovementioned protrusions 170-170d are out of the corresponding selected ranges, abrasive particles 118 and the debris 122 may not be effectively removed from the polishing pad 106. In some embodiments, the dimensions of the abovementioned protrusions 170-170d are less than a width of the retainer ring 114.

Figure 9B:
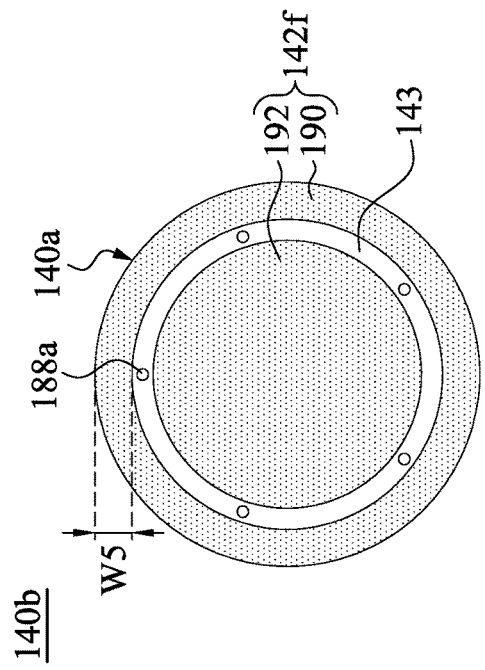
FIGS. 9A-9C illustrate a bottom surface of the conditioning disk in FIG. 7 in accordance with some embodiments.
Figure 9C:
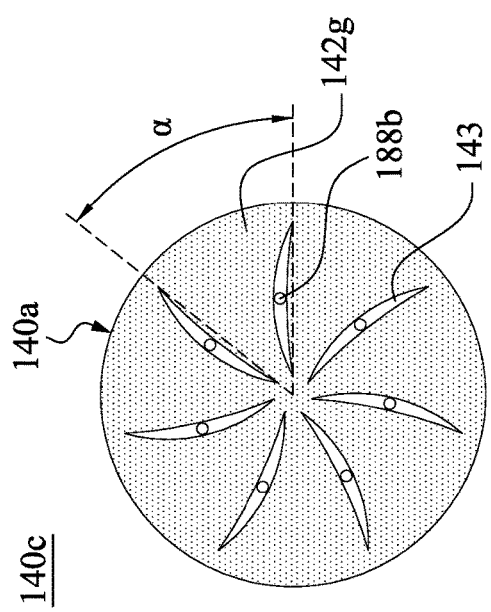
Figure 9A:
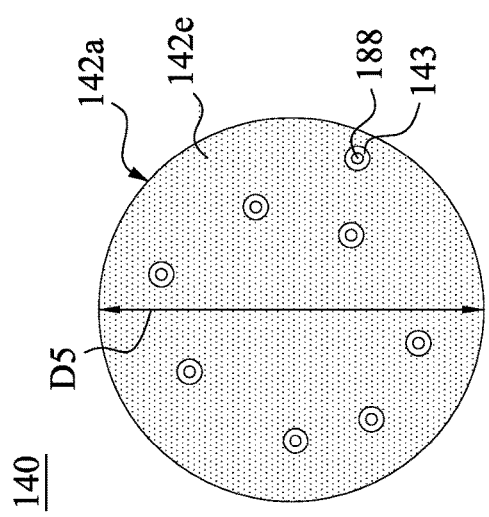

FIGS. 9A-9C illustrate the bottom surface of the conditioning disk with various geometrical distribution in FIG. 7 in accordance with some embodiments. The engraved regions of the bottom surface of the conditioning disk may have various geometrical distributions, for example, distributions shown in FIGS. 9A-9C. As shown in FIG. 9A, in some embodiments, the distribution of the engraved region 142e of the conditioning disk 140 may be circular-shaped including a diameter D5 ranging from about 5 inches to about 6 inches. The conditioning disk 140 includes at least one second vacuum hole 188 formed on the bottom surface 140a of the conditioning disk 140. The second vacuum hole 188 may be connected to a second vacuum pump 148 in order to reduce the pressure and generate at least a partial vacuum within the second vacuum hole 188 (see FIG. 7). FIG. 9B shows another conditioning disk 140b similar to the conditioning disk 140, except for the positions of the second vacuum holes 188a and the distribution of the engraved region 142f. In greater detail, in some embodiments, the distribution of the engraved region 142f is donut-shaped including a ring-shaped portion 190 that encloses a circular shape portion 192. The ring-shaped portion 190 of the engraved region 142f has a width W5 ranging from about 0.2 inches to about 0.8 inches in some embodiments. The second vacuum hole 188a may be disposed between the ring-shaped portion 190 and the circular shape portion 192. FIG. 9C shows another conditioning disk 140c similar to the conditioning disk 140, except for the positions of the second vacuum holes 188b and the engraved region 142g. In greater detail, in some embodiments, the distribution of the engraved region 142g is sector-shaped with a central angle α in radians. The central angle α of the sector-shaped engraved region 142g may be an acute angle in a range from about 10 degrees to about 90 degrees. In some other embodiments, the central angle α of the sector-shaped engraved region 142g may be an obtuse angle. The second vacuum holes 188b may be disposed between the engraved regions 142g. However, it is understood that the number of the second vacuum holes 188-188b is only for illustration purposes and are not limiting. In some embodiments, the protrusions 170-170d (see FIGS. 8A-8E) and the non-engraved region 143, which is a substantially flat region, are monolithic. In other words, the protrusions 170-170d (see FIGS. 8A-8E) and the non-engraved region 143, which is a substantially flat region, are one-piece formed.

Figure 10:
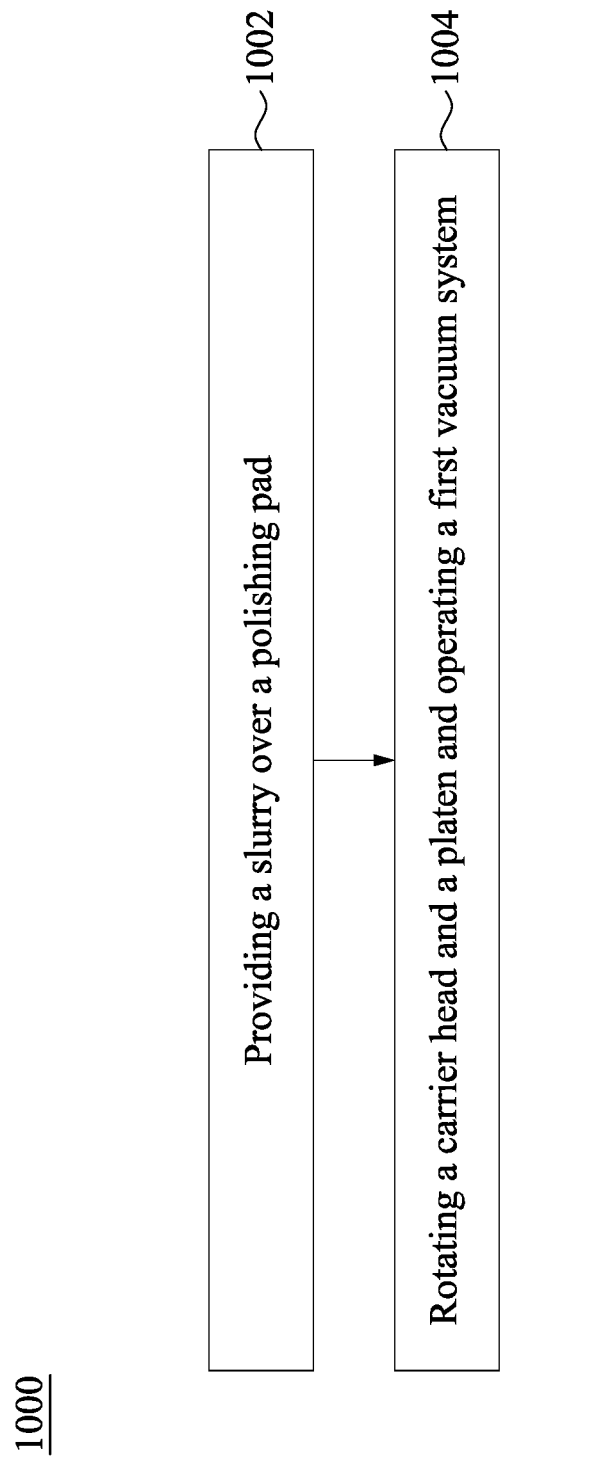
FIG. 10 is a flow chart showing an illustrative method for using a CMP process on a wafer in accordance with some embodiments.
Figure 11:
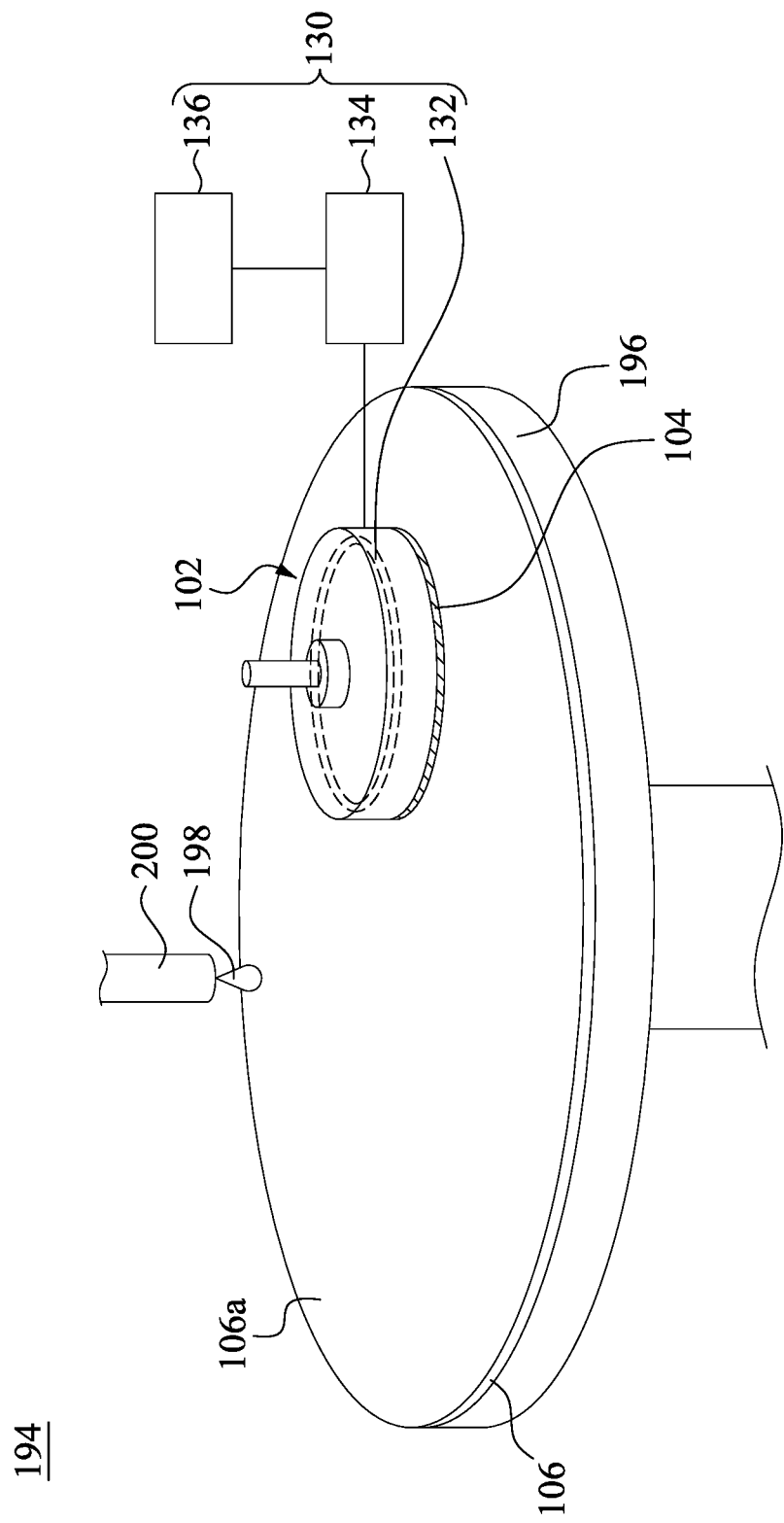
FIGS. 11 and 12 illustrate schematic perspective views of a CMP process corresponding to the flow chart in FIG. 10 in accordance with some embodiments.
Figure 12:
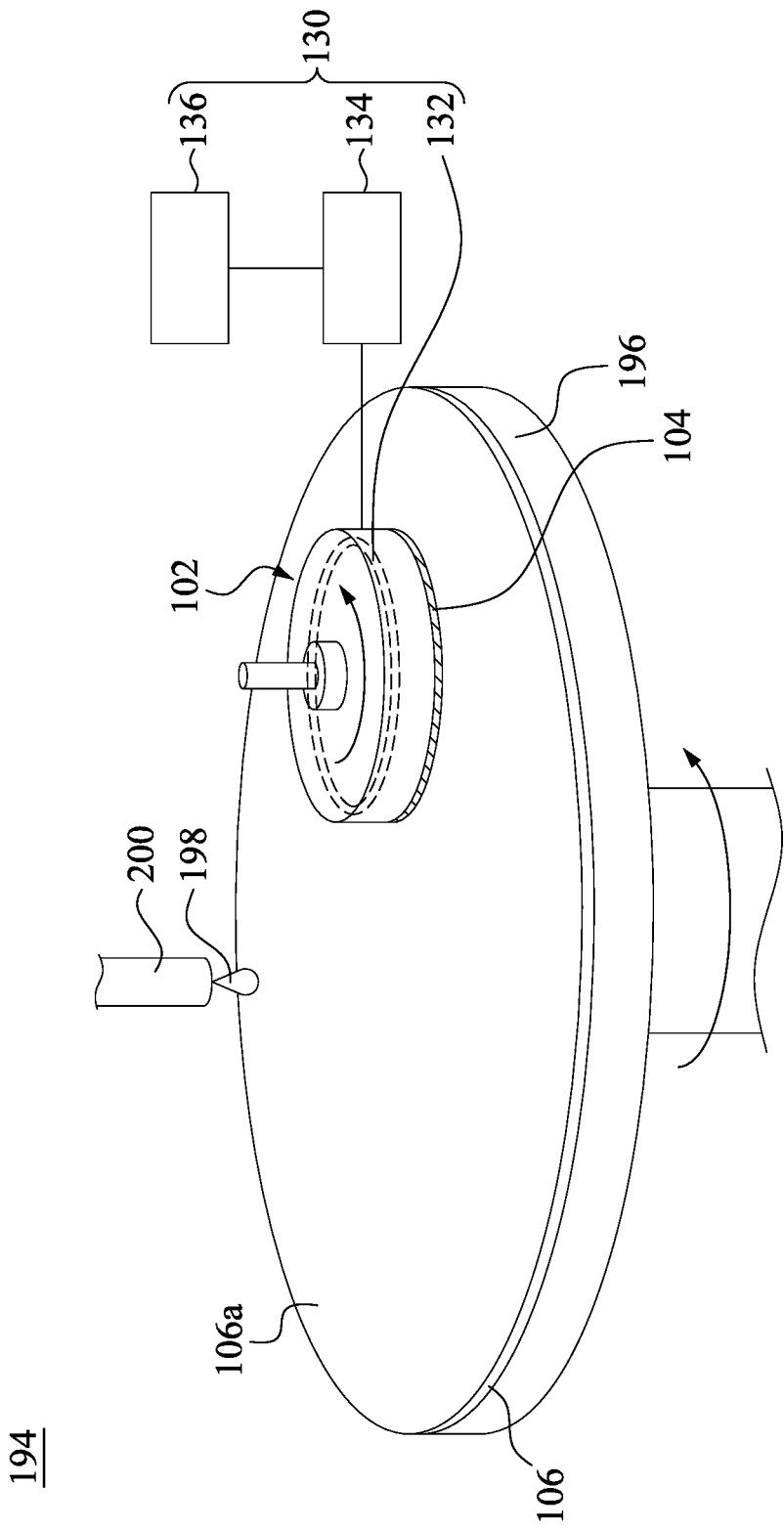

FIG. 10 is a flow chart showing an illustrative method 1000 for using a CMP process on a wafer 104. Additional steps can be provided before, during, and after the method, and some of the steps described can be replaced or eliminated for other embodiments of the method. FIGS. 11 and 12 illustrate schematic perspective views of intermediate stages in the CMP process corresponding to the flow chart in FIG. 10 in accordance with some embodiments.

As illustrated in FIG. 11, a CMP system 194 includes a platen 196, a polishing pad 106 over the platen 196, a carrier head 102 over the polishing pad 106, and a first vacuum system 130 coupled to the carrier head 102. The to-be-polished wafer 104 is placed proximate to the polishing pad 106. The first vacuum system 130 includes a first vacuum port 132, e.g., a plurality of first vacuum holes 152 disposed on the non-engraved region 129 of the bottom portion 126 of the retainer ring 114 (see FIGS. 4A, 4B, and 5). The first vacuum port 132 is connected to a first vacuum pump 134. The first vacuum pump 134 is controlled by the first controller 136. The method 1000 begins at block 1002 where a slurry is provided over the polishing pad. With reference to FIG. 11, in some embodiments of block 1002, a slurry 198 is dispensed by a slurry dispenser 200 over the polishing pad 106. The slurry dispenser 200 has an outlet directly over the polishing pad 106 in order to dispense the slurry 198 onto the polishing pad 106. The slurry 198 includes a reactive chemical solution that reacts with the surface layer of the wafer 104. Furthermore, the slurry includes abrasive particles (e.g., abrasive particles 118 in FIG. 2) for mechanically polishing the wafer 104.

Returning to FIG. 10, the method 1000 then proceeds to block 1004 where the carrier head and the platen are rotated and the first vacuum system is operated. With reference to FIG. 12, in some embodiments of block 1004, the carrier head 102 and the platen 196 are rotated and the first vacuum system 130 is operated. In greater detail, the platen 196 is rotated by a mechanism (not shown), and hence the polishing pad 106 fixed thereon is also rotated along with the platen 196. The wafer 104 is pressed against the polishing pad 106, the carrier head 102 is rotated hence causes the rotation of the wafer 104 which is fixed onto the carrier head 102, and the first vacuum pump 134 is run to apply the vacuum suction force. In some embodiments, applying the vacuum suction force and moving the carrier head 102 can be performed substantially synchronously. In some other embodiments, applying the vacuum suction force is performed after moving the carrier head 102. The carrier head 102 moves relative to the polishing pad 106. The engraved region 128 (see FIG. 1) of the bottom portion 126 of the retainer ring 114 is in friction engagement with the polishing pad 106 during moving the carrier head 102 to condition the polishing pad 106. Therefore, the engraved region 128 of the retainer ring 114 dislodges the debris 122 and the abrasive particles 118 trapped in the polishing pad 106. The first vacuum pump 134 applies the vacuum suction force with a pressure in a direction away from the polishing pad 106 to refresh the top surface 106a of the polishing pad 106 through the first vacuum port 132 (e.g., the first vacuum holes 152 in FIGS. 4A, 4B and 5). In other words, the pressure in a space between the first vacuum port 132 and the top surface 106a of the polishing pad 106 is lower than the atmospheric pressure in which the CMP system 194 is situated. As a result, removable materials, such as polishing detritus including the debris 122, the slurry 198 (e.g., abrasive particles 118), on the top surface 106a of the polishing pad 106 and in the space between the first vacuum port 132 and the top surface 106a of the polishing pad 106 are drawn into and collected by the first vacuum system 130 during the polishing process. In some embodiments, the carrier head 102 and the polishing pad 106 rotate in the same direction (clockwise or counter-clockwise). In accordance with alternative embodiments, the carrier head 102 and the polishing pad 106 rotate in opposite directions. The mechanism for rotating the carrier head 102 is not illustrated. With the rotation of the polishing pad 106 and the carrier head 102, the slurry 198 flows between the wafer 104 and the polishing pad 106. Through the chemical reaction between the reactive chemical solution in the slurry 198 and the surface layer of the wafer 104, and further through the mechanical polishing, the surface layer of the wafer 104 is removed. Therefore, the wafer 104 can be effectively polished and the polishing pad 106 can be reconditioned substantially synchronously without disposing a conditioning disk, which can be costly, thereby saving production cost and time.

Figure 13:
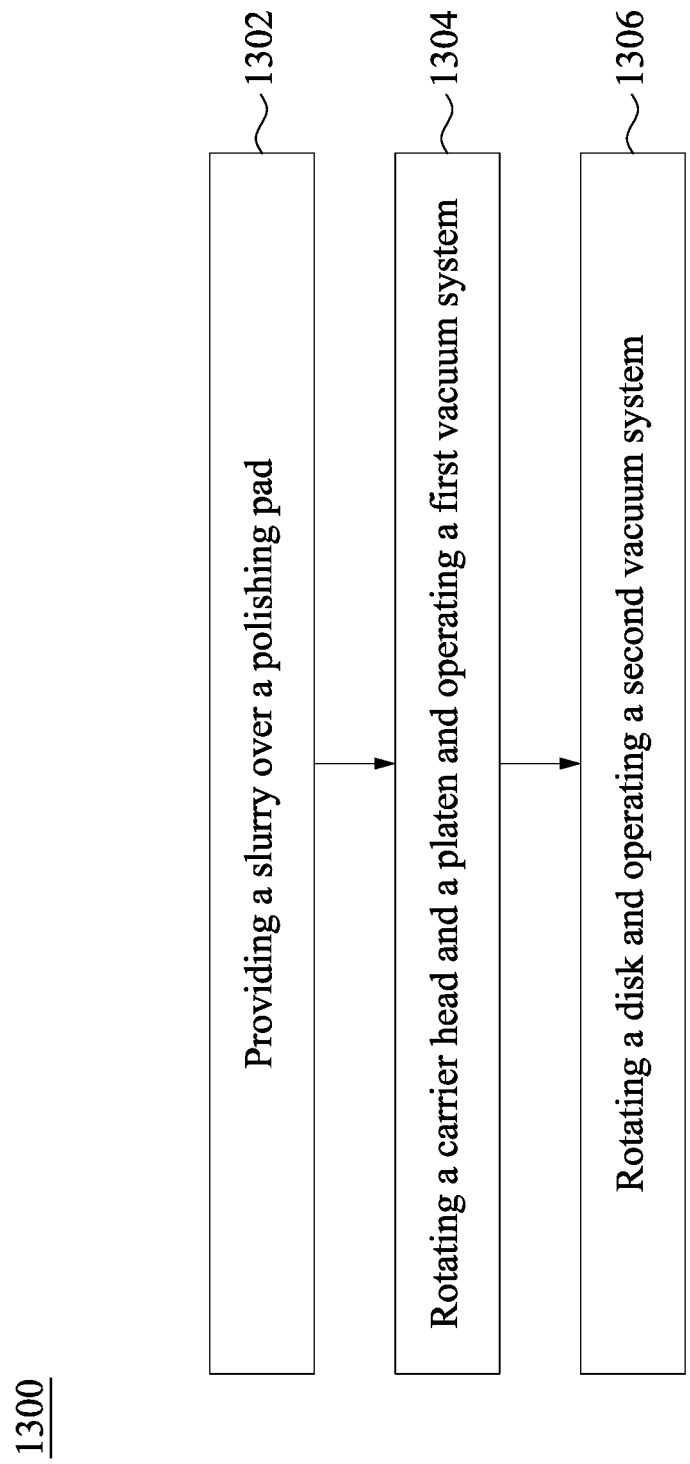
FIG. 13 is a flow chart showing an illustrative method for using a CMP process on a wafer.
Figure 14:
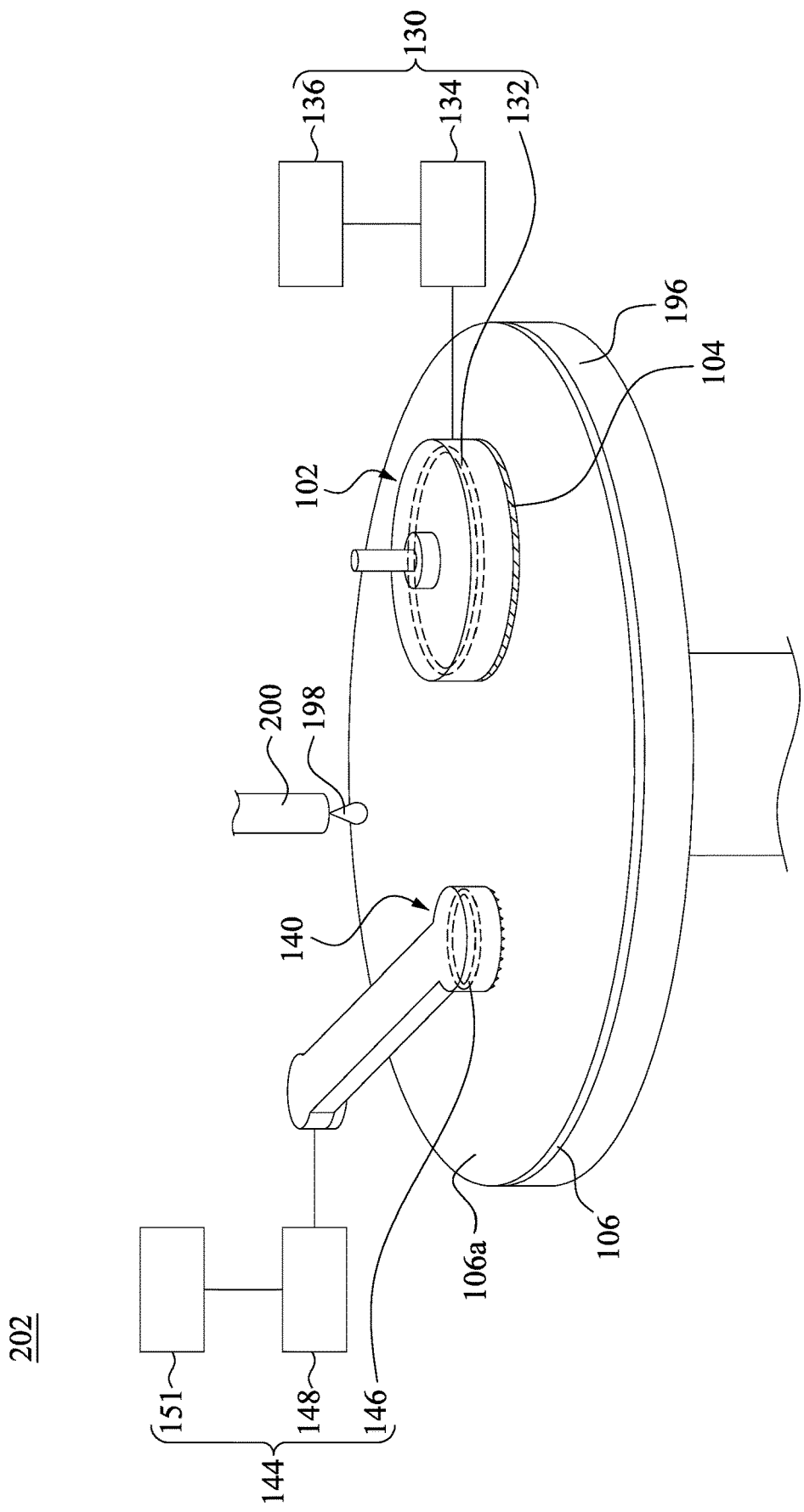
FIGS. 14-16 illustrate schematic perspective views of a CMP process corresponding to the flow chart in FIG. 13 in accordance with some embodiments.
Figure 15:
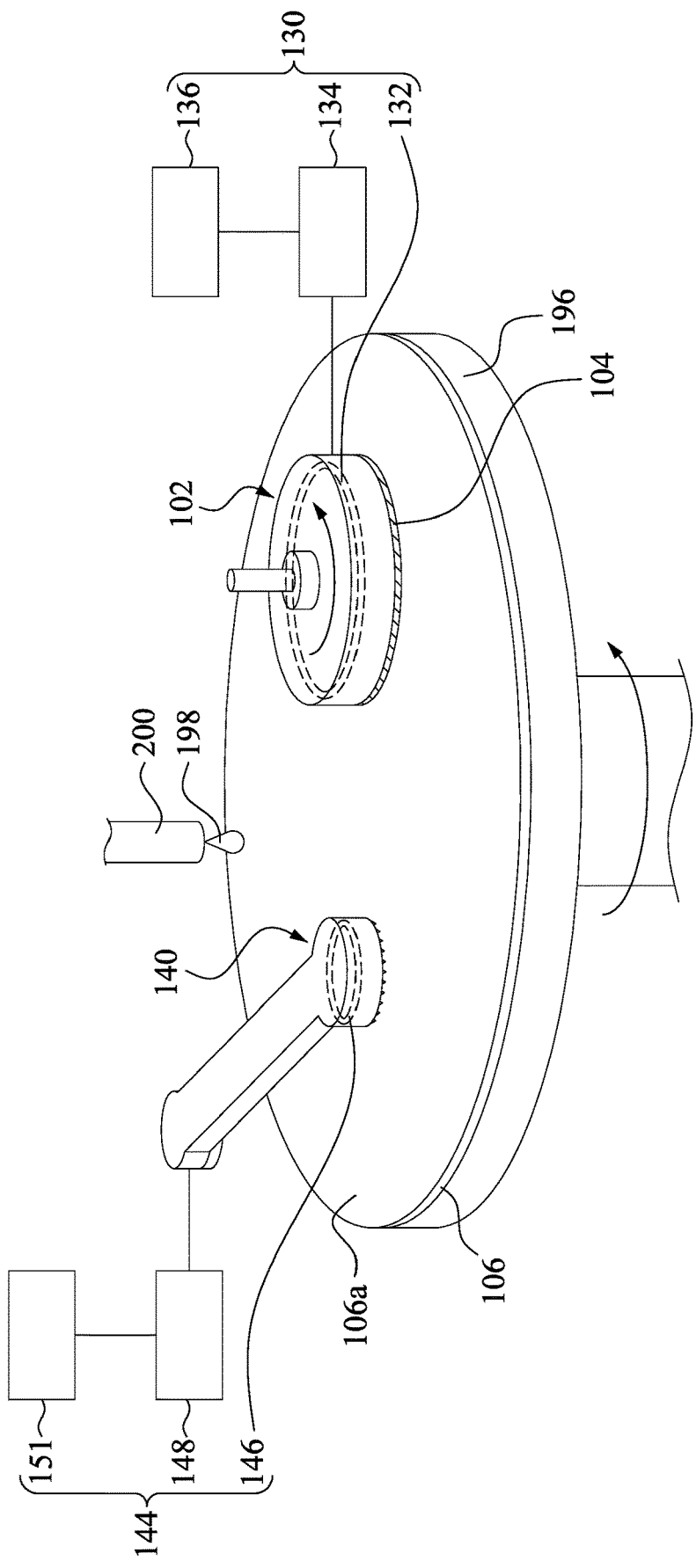
Figure 16:
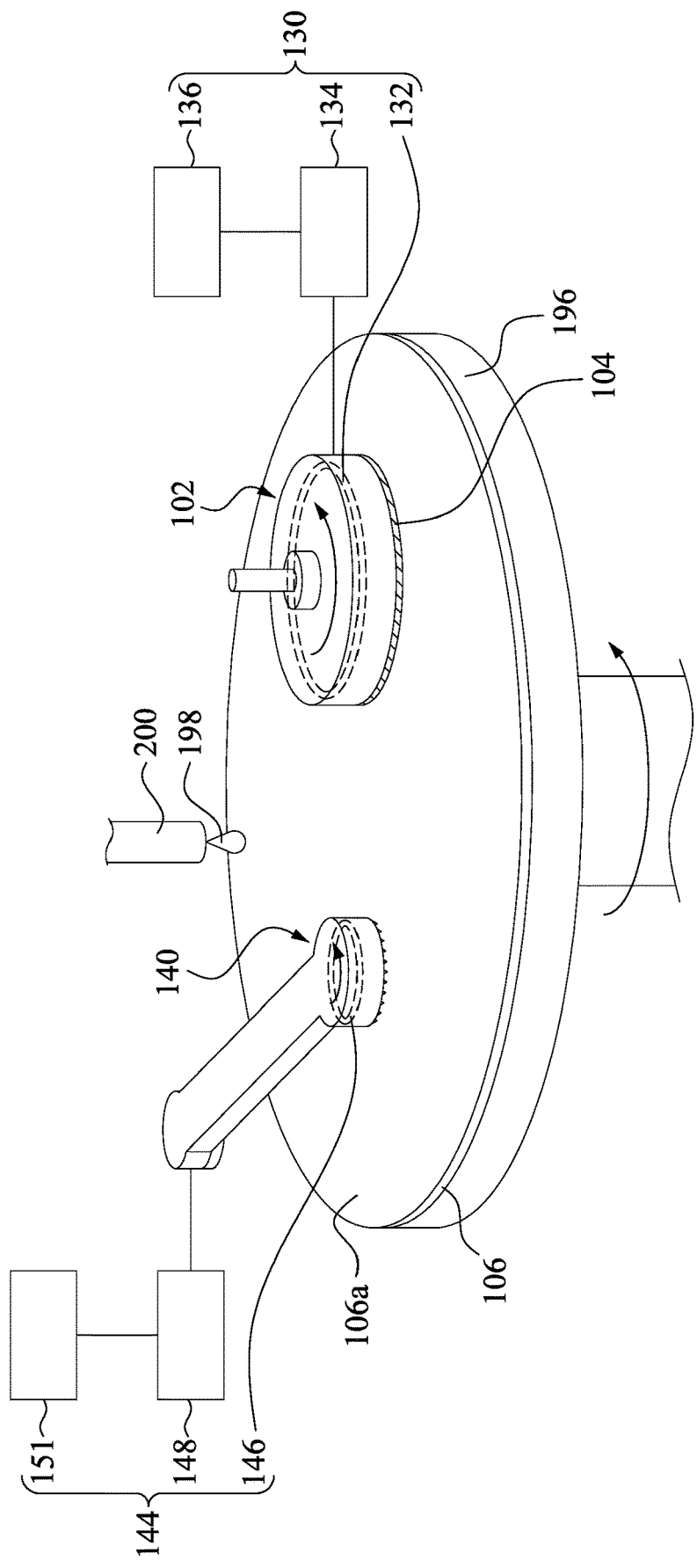

Embodiments of the disclosure are not limited to the embodiments mentioned above. FIG. 13 is a flow chart showing an illustrative method 1300 for using a CMP process on the wafer 104 in accordance with another embodiment. Additional steps can be provided before, during, and after the method, and some of the steps described can be replaced or eliminated for other embodiments of the method. FIGS. 14-16 illustrate schematic perspective views of intermediate stages in the CMP process corresponding to the flow chart in FIG. 13 in accordance with some embodiments.

As illustrated in FIG. 14, a CMP system 202 is similar to the CMP system 194, except for a conditioning disk 140 over the polishing pad 106 and a second vacuum system 144 coupled to the conditioning disk 140. The second vacuum system 144 includes a second vacuum port 146, e.g., a plurality of second vacuum holes 188 disposed on the non-engraved region 143 of the bottom surface 140a of the conditioning disk 140 (see FIGS. 9A-9C). The method 1300 begins at block 1302 where a slurry is provided over the polishing pad. With reference to FIG. 14, in some embodiments of block 1302, a slurry 198 is dispensed by a slurry dispenser 200 over the polishing pad 106. Since the slurry 198 is dispensed as discussed previously with regard to FIG. 11, a detailed description of the same is omitted herein for the sake of brevity.

Returning to FIG. 13, the method 1300 then proceeds to block 1304 where the carrier head and the platen are rotated and the first vacuum system is operated. With reference with FIG. 15, in some embodiments of block 1304, the carrier head 102 and the platen 196 are rotated and the first vacuum system 130 is operated. Since the carrier head 102 and the platen 196 are rotated and the first vacuum system 130 is operated as discussed previously with regard to FIG. 12, a detailed description of the same is omitted herein for the sake of brevity.

Returning to FIG. 13, the method 1300 then proceeds to block 1306 where a conditioning disk is rotated and a second vacuum system is operated. With reference to FIG. 16, in some embodiments of block 1306, a conditioning disk 140 is rotated and a second vacuum system 144 is operated. In greater detail, the polishing pad 106 is conditioned using the conditioning disk 140, in which the conditioning disk 140 is rotated and the second vacuum pump 148 coupled to the conditioning disk 140 is run such that the second vacuum pump 148 applies vacuum suction force with a pressure in a direction away from the polishing pad 106. The engraved regions 142 formed on the bottom surface 140a of the conditioning disk 140 can help dislodge the debris 122 and the abrasive particles 118 trapped in the polishing pad 106 to refresh the top surface 106a of the polishing pad 106. As a result, the polishing pad 106 is conditioned and capable of holding newly provided slurry. In some embodiments, the conditioning using the conditioning disk 140 is performed during the polishing the wafer 104. In other words, the conditioning the conditioning disk 140 and the polishing the wafer 104 are performed substantially simultaneously. In some other embodiments, the conditioning using the conditioning disk 140 is performed after the polishing the wafer 104.

Figure 17:
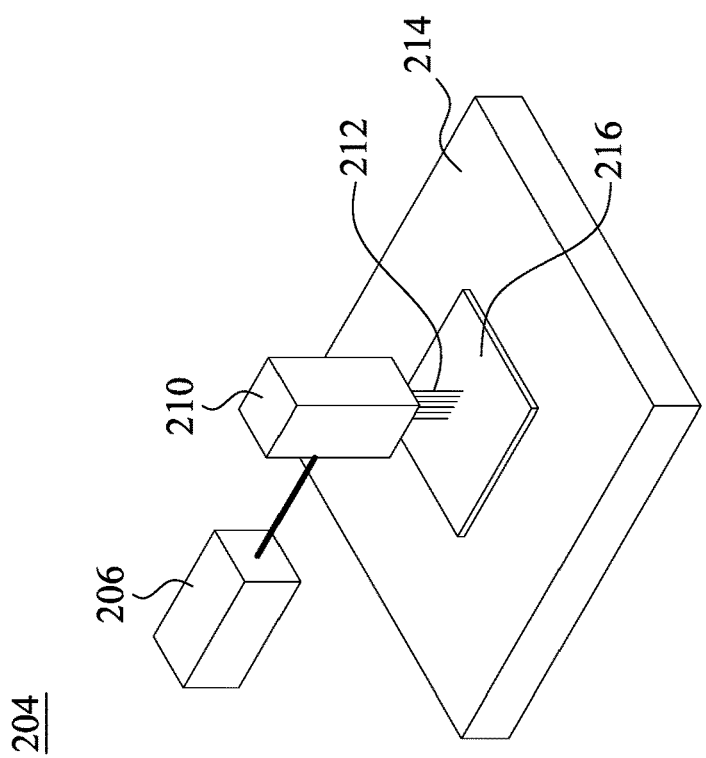
FIG. 17 is a schematic diagram of a laser processing apparatus in accordance with some embodiments.

As discussed previously, in some embodiments, the engraved regions 128 of the bottom portion 126 of the retainer ring 114 and the engraved regions 142 on the bottom surface 140a of the conditioning disk 140 may be formed using an ultra-precision machining method, for example, a method using a laser processing apparatus or a superfine processing machine. FIG. 17 is a schematic diagram of a laser processing apparatus in accordance with some embodiments. As shown in FIG. 17, a laser processing apparatus 204 includes a laser generator 206 generating a laser beam 208, a beam splitting optical system 210 for controlling the number of sub-laser beams 212 by dividing the laser beam 208 into a plurality of sub-laser beams 212, and a stage 214 to which a processing target 216 (e.g., the retainer ring 114 or the conditioning disk 140) processed with the laser beam 208 is mounted and controlling a location of the processing target 216. The laser generator 206 may be a pico second laser generator or a femto second-to-micro second laser generator. The sub-laser beams 212 generated by the laser generator 206 can be focused to a spot size of from about 10 nm to about 20 µm.

Figure 18:
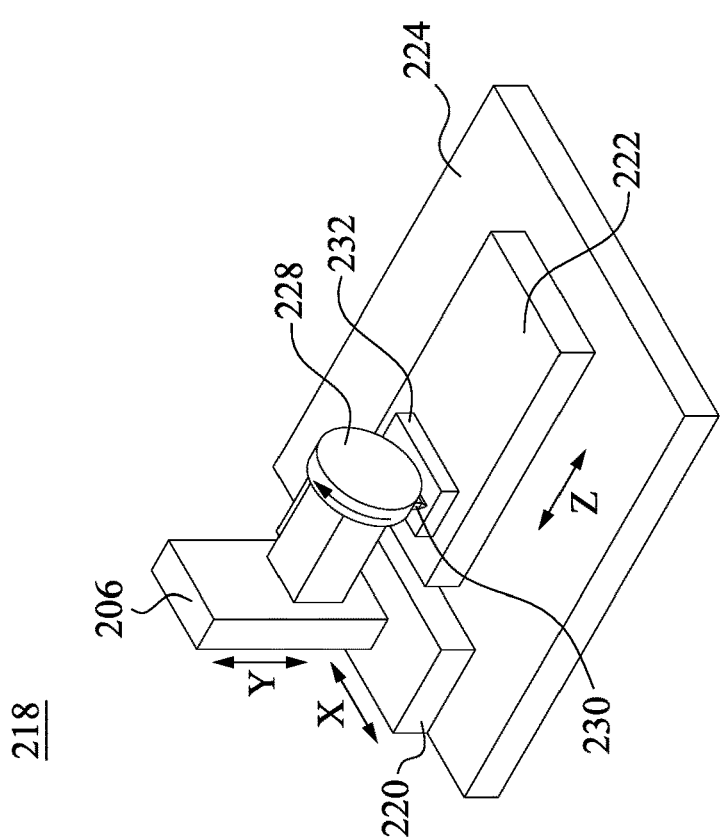
FIG. 18 is a perspective view of a superfine processing machine in accordance with some embodiments.

FIG. 18 is a perspective view of a superfine processing machine 218 in accordance with some embodiments which has therein an orthogonal, triaxial and movable stage and a rotating mechanism that rotates a diamond tool. In FIG. 18, X-axis table 220 that is driven in the X-axis direction and Z-axis table 222 that is driven in the Z-axis direction are mounted on a machine platen 224. On the X-axis table 220, there is fixed Y-axis stage 226 that is driven in the Y-axis direction, and rotating mechanism 228 that rotates a diamond tool 230 is fixed on the Y-axis stage 226. Its axis of rotation is in parallel with Z-axis. Further, a workpiece 232 (e.g., the retainer ring 114 or the conditioning disk 140) is clamped on the Z-axis table 222. A method of cutting operation employing the superfine processing machine shown in FIG. 18 is a method wherein a transfer optical surface is created with an enveloping surface of a tool locus, when repeating actions to feed the workpiece 232 slightly in the Z-axis direction by the Z-axis table 222 after cutting by feeding in the X-axis direction by the X-axis table 220, while rotating the diamond tool 230 at a high speed, and it is one called generally a fly cutting method. High speed processing can be conducted with less load on the point of a blade even when feeding in the X-axis direction is increased.

FIGS. 19-25 illustrate perspective views and cross-sectional views of intermediate stages in the formation of Fin Field-Effect Transistors (FinFETs) in accordance with some embodiments that involves a CMP process using the CMP tool as discussed previously. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 19:
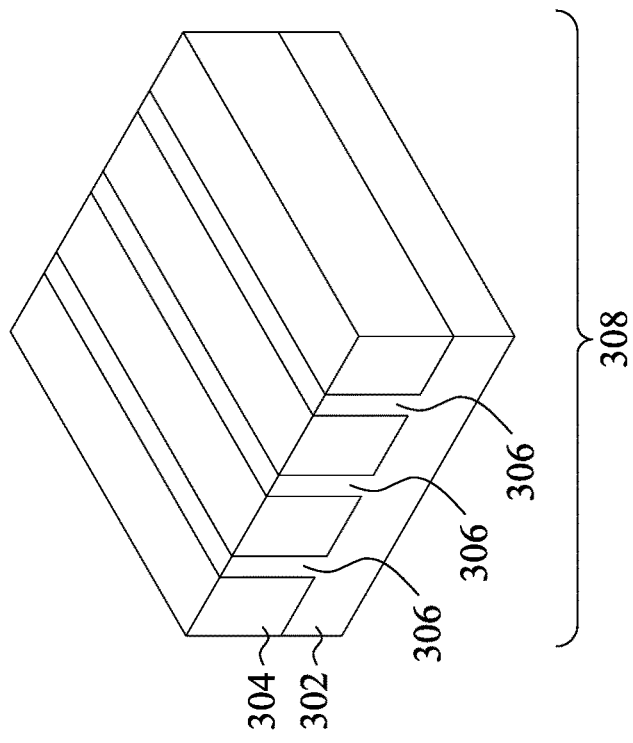

FIG. 19 illustrates a perspective view of an initial structure. The initial structure includes a wafer 104a, which further includes a substrate 302. The substrate 302 may be a semiconductor substrate, which may be a silicon substrate, a silicon germanium substrate, or a substrate formed of other semiconductor materials. In accordance with some embodiments of the present disclosure, the substrate 302 includes a bulk silicon substrate and an epitaxy silicon germanium (SiGe) layer or a germanium layer (without silicon therein) over the bulk silicon substrate. The substrate 302 may be doped with a p-type or an n-type impurity. Isolation regions 304 such as Shallow Trench Isolation (STI) regions may be formed to extend into the substrate 302. The portions of the substrate 302 between the neighboring STI regions 304 are referred to as semiconductor strips 306, which are in a device region 308. The device region 308 is a p-type transistor region, in which a p-type transistor such as a p-type FinFET is to be formed or an n-type transistor region, in which an n-type transistor such as an n-type FinFET is to be formed.

The STI regions 304 may include a liner oxide (not shown). The liner oxide may be formed of a thermal oxide formed through a thermal oxidation of a surface layer of the substrate 302. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The STI regions 304 may also include a dielectric material over the liner oxide, and the dielectric material may be formed using Flowable Chemical Vapor Deposition (FCVD), spin-on coating, or the like.

Figure 20:
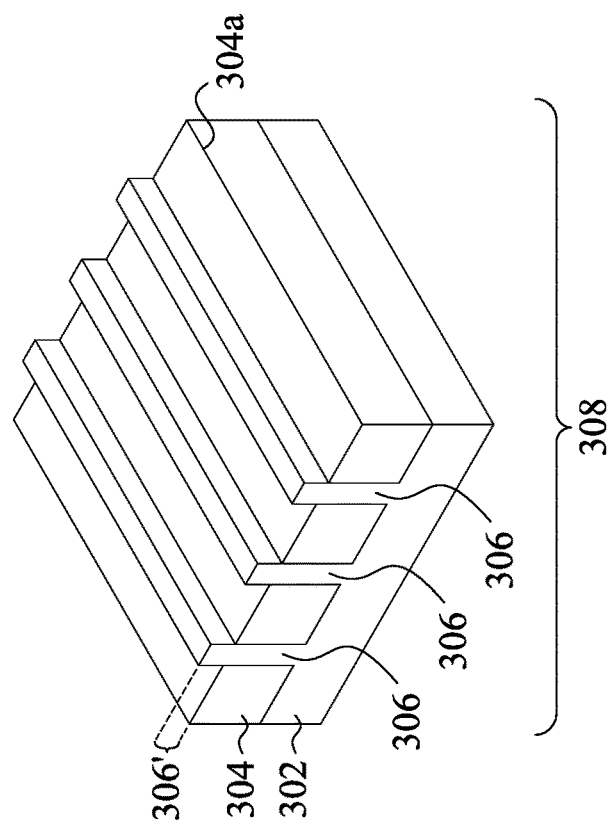

Referring to FIG. 20, the STI regions 304 are recessed, so that the top portions of the semiconductor strips 306 protrude higher than a top surfaces 304a of the neighboring STI regions 304 to form protruding fins 306'. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the STI regions 304 is performed using a wet etch process. The etching chemical may include diluted HF, for example.

The materials of the protruding fins 306' may also be replaced with materials different from that of the substrate 302. For example, the protruding fins 306' may be formed of an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

Figures 21, 22:
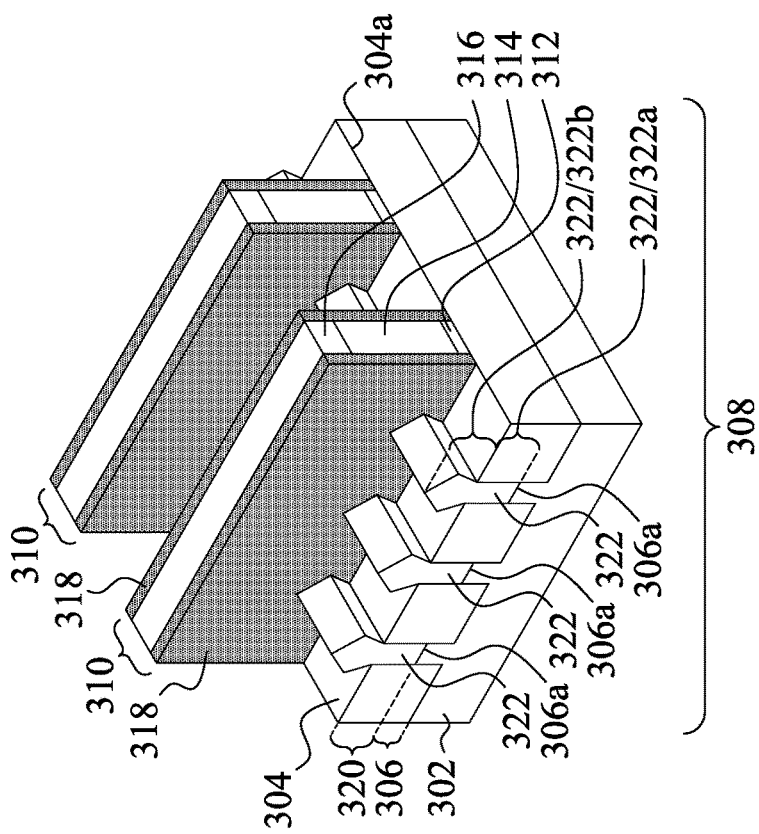

Referring to FIG. 21, dummy gate stacks 310 are formed on the top surfaces and the sidewalls of protruding fins 306'. The dummy gate stacks 310 may include dummy gate dielectrics 312 and dummy gate electrodes 314 over the dummy gate dielectrics 312. Dummy gate electrodes 314 may be formed, for example, using polysilicon, and other materials may also be used. The dummy gate stacks 310 may also include one (or a plurality of) hard mask layers 316. The hard mask layer 316 may be formed of SiN, SiO, SiC, SiOC, SiON, SiCN, SiOCN, TiN, AlON, $Al_2O_3$, or the like. The dummy gate stacks 310 crosses over a single one or a plurality of protruding fins 306'. The dummy gate stack 310 may also have lengthwise directions perpendicular to the lengthwise directions of the respective protruding fins 306'.

Gate spacers 318 are formed on the sidewalls of the dummy gate stacks 310. In the meantime, fin spacers (not shown) may also be formed on the sidewalls of protruding fins 306'. In accordance with some embodiments of the present disclosure, gate spacers 318 are formed of an oxygen-containing dielectric material(s) such as silicon oxynitride (SiON), silicon oxy-carbo-nitride (SiOCN), silicon oxide ($SiO_2$), silicon oxy-carbide (SiOC), or the like. Non-oxygen-containing materials such as silicon nitride (SiN) and/or silicon carbide (SiC) may also be used to form gate spacers 318, depending on the formation method of the subsequently formed inhibitor film. Gate spacers 318 may include air-gaps, or may formed as including pores, and may have a single-layer structure or a multi-layer structure including a plurality of dielectric layers.

An etching step (referred to as source/drain recessing hereinafter) is then performed to etch the portions of the protruding fins 306' that are not covered by the dummy gate stack 310 and the gate spacers 318. The recessing may be anisotropic, and hence the portions of protruding fins 306' directly underlying the dummy gate stack 310 and the gate spacers 318 are protected, and are not etched. The top surfaces 306a of the recessed semiconductor strips 306 may be lower than the top surfaces 304a of the STI regions 304 in accordance with some embodiments. Recesses 320 are accordingly formed between the STI regions 304. The recesses 320 are located on opposite sides of the dummy gate stack 310. Next, epitaxy regions 322 (source/drain regions) are formed by selectively growing a semiconductor material in the recesses 320, resulting in the structure in FIG. 22. In some other embodiments, some adjacent epitaxy regions 322 may grow together to form a merged epitaxial structure. In some embodiments, the epitaxy regions 322 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, the epitaxy regions 322 may include SiGe, SiGeB, Ge, GeSn, or the like. In some cases, the epitaxy regions 322 of an n-type FinFET may include silicon, SiC, SiCP, SiP, or the like. In some embodiments of the present disclosure, the epitaxy regions 322 comprise III-V compound semiconductors such as GaAs, InP, GaN, InGaAs, InAlAs, GaSb, AlSb, AlAs, AlP, GaP, combinations thereof, or multi-layers thereof. After the recesses 320 are filled with the epitaxy regions 322, the further epitaxial growth of the epitaxy regions 322 causes the epitaxy regions 322 to expand horizontally, and facets may be formed.

After the epitaxy step, the epitaxy regions 322 may be further implanted with a p-type or an n-type impurity to form source and drain regions, which are also denoted using reference numeral 322. In some embodiments, the implantation step is skipped since the epitaxy regions 322 are in-situ doped with the p-type or n-type impurity during the epitaxy. The epitaxy regions 322 include lower portions 322a that are formed in the STI regions 304, and upper portions 322b that are formed over the top surfaces 304a of the STI regions 304. The lower portions 322a, whose sidewalls are shaped by the shapes of the recesses 320 may have (substantially) straight edges, which may also be substantial vertical edges that are substantially perpendicular to the major surfaces of substrate 302.

Contact Etch Stop Layer (CESL) 324 and Inter-Layer Dielectric (ILD) 326 are then formed, as shown in FIG. 23A, which illustrate a perspective view. The CESL 324 may be formed of SiN, SiCN, SiOC, SiON, SiCN, SiOCN, or the like. In accordance with some embodiments of the present disclosure, the CESL 324 may include or may be free from oxygen therein. The CESL 324 may be formed using a conformal deposition method such as ALD or CVD, for example. The ILD 236 may include a dielectric material formed using, for example, FCVD, spin-on coating, CVD, or another deposition method. The ILD 326 may also be formed of an oxygen-containing dielectric material, which may be silicon-oxide (SiO) based or silicon-oxycarbide (SiOC) based such as Tetra Ethyl Ortho Silicate (TEOS) oxide, Plasma-Enhanced CVD (PECVD) oxide (SiO$_2$), Phospho-Silicate Glass (PSG), Boro-Silicate Glass (BSG), Boron-Doped Phospho-Silicate Glass (BPSG), or the like. A slurry includes abrasive particles 118 is provided on the top surface 106a of the polishing pad 106 (see FIGS. 11 and 14) to polish the wafer 104a (e.g., portions of the ILD 326, the dummy gate stacks 310, and the gate spacers 318). The abrasive particles 118 schematically illustrated as over a top surface of the ILD 326 are not part of the wafer 104a for illustration purposes. FIG. 23B shows a cross-sectional view obtained from the vertical plane containing line A-A in FIG. 23A.

Figure 24A:
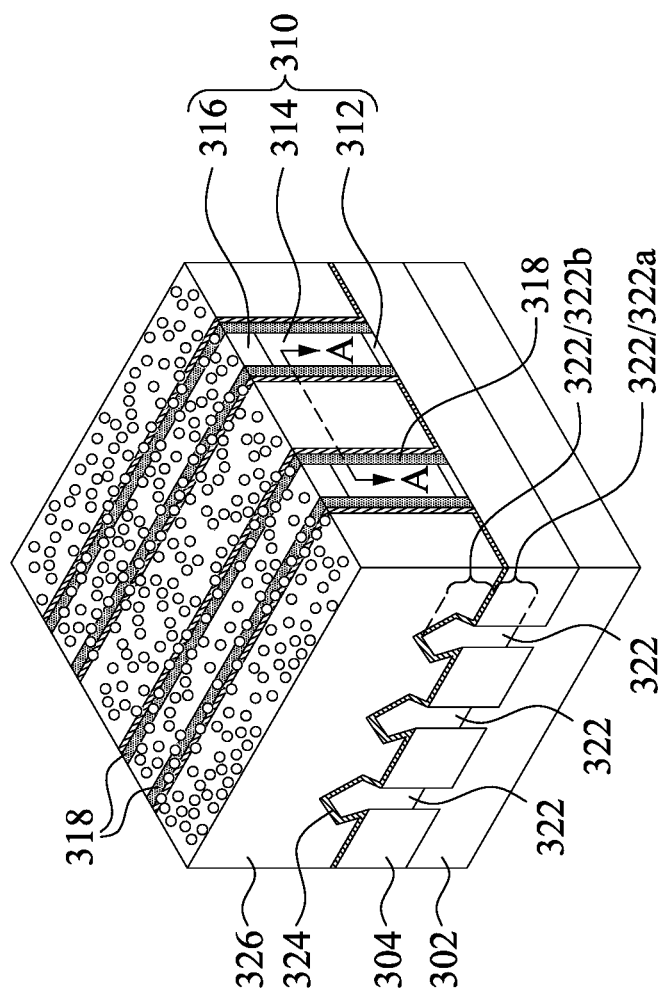
Figure 24B:
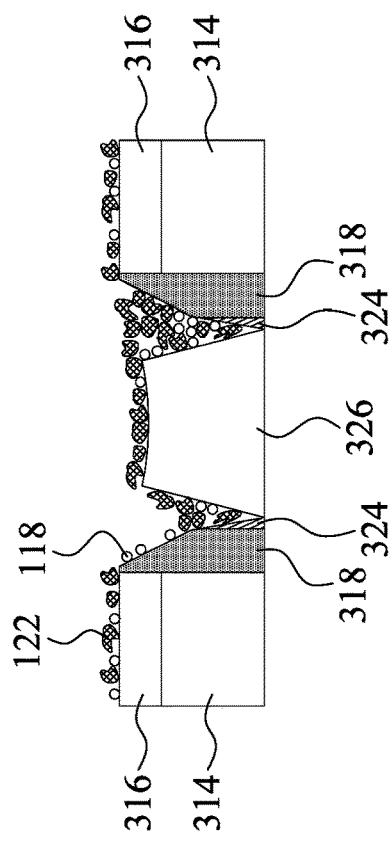
Figure 24C:
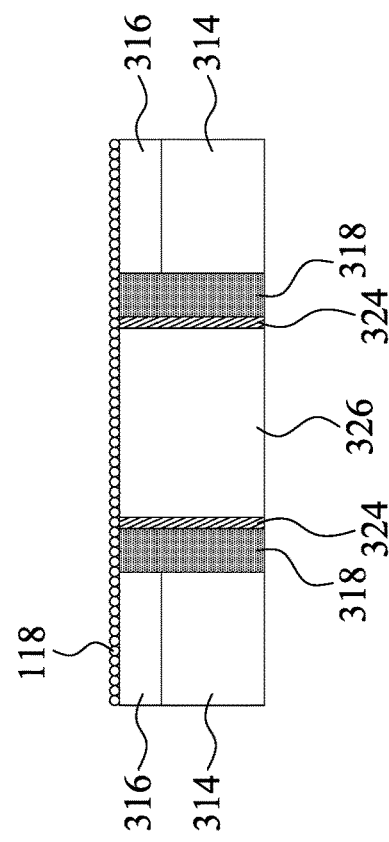

A planarization step such as Chemical Mechanical Polish (CMP) or mechanical grinding using the CMP systems 194 and 202 shown in FIG. 1 or 7 and the methods 1000 or 1300 shown in FIG. 10 or FIG. 13 may be performed to level the top surfaces of the ILD 326, the dummy gate stacks 310, and the gate spacers 318 with each other, as shown in FIGS. 24A and 24B. If the planarization step is performed without using the CMP system or methods as discussed previously, the ILD 326 would be dished, as shown in FIG. 24C. That is, some debris 122 and abrasive particles 118 may accumulate at an interface between the ILD 326 and the dummy gate stacks 310 and lead to a dishing effect on the ILD 326, the CESL 324, and the gate spacer 318.

Figure 25:
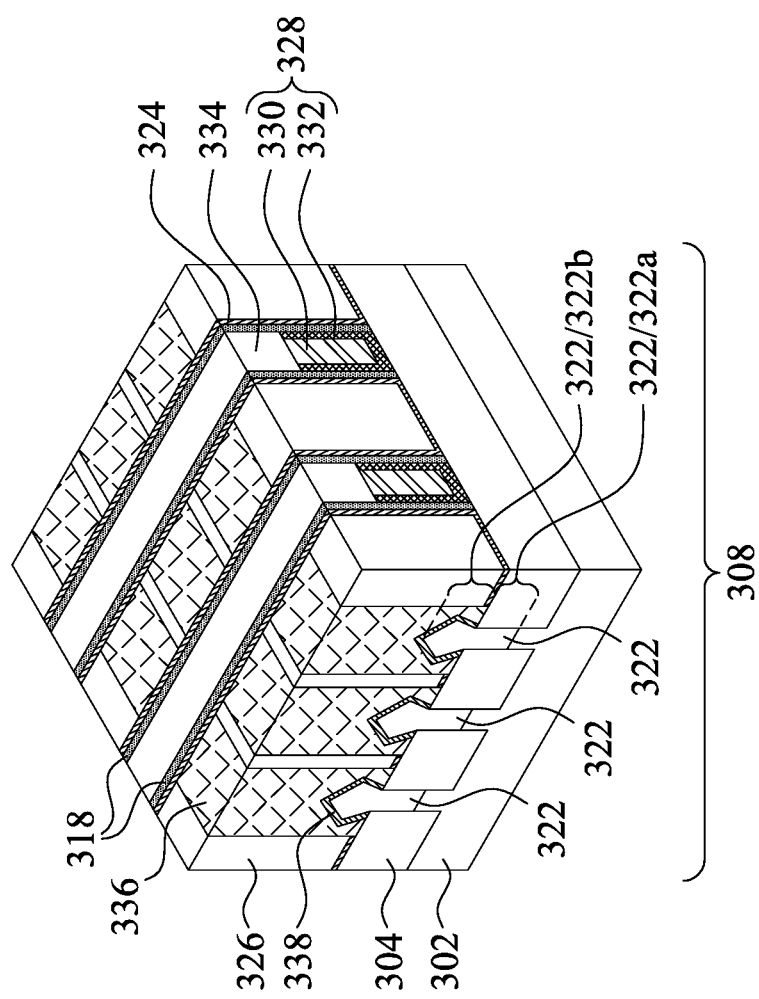

After the CMP process, the dummy gate stack 310, which includes the hard mask layer 316, the dummy gate electrode 314 and the dummy gate dielectric 312, is replaced with a replacement gate stack 328, which includes a gate electrode 330 and a replacement gate dielectric 332 as shown in FIG. 25.

When replacing the dummy gate stack 310, the hard mask layers 316, the dummy gate electrodes 314 and the dummy gate dielectrics 312 (FIGS. 24A and 24B) are first removed in one or a plurality of etching steps, resulting in a trench (opening) to be formed between the gate spacers 318. In the formation of the replacement gates, a gate dielectric 332 (FIG. 25) is first formed, which extends into the recess left by the removed dummy gate stack 310, and may have a portion extending over the ILD 326. In accordance with some embodiments of the present disclosure, the gate dielectric 332 includes an Interfacial Layer (IL, not shown separately) as its lower part. The IL may include an oxide layer such as a silicon oxide layer, which is formed through a chemical oxidation process or a deposition process. The gate dielectric 332 may also include a high-k dielectric layer formed over the IL. The high-k dielectric layer is formed as a conformal layer, and includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer in the gate dielectric 332 is formed using ALD or CVD.

The gate electrode 330 is formed over the gate dielectric 332 and filling the remaining portion of the recess. The formation of the gate electrode 330 may include a plurality of deposition processes to deposit a plurality of conductive layers, and performing a planarization step to remove the excess portions of the conductive layers over the ILD 326. The deposition of the conductive layers may be performed using conformal deposition methods such as ALD or CVD.

The gate electrode 330 may include a diffusion barrier layer and a work-function layer (or a plurality of work-function layers) over the diffusion barrier layer. The diffusion barrier layer may be formed of titanium nitride (TiN), which may (or may not) be doped with silicon to form TiSiN. The work-function layer determines the work function of the gate, and includes at least one layer, or a plurality of layers formed of different materials. The specific material of the work-function layer is selected according to whether the respective FinFET is an n-type FinFET or a p-type FinFET. For example, for the n-type FinFET in the n-type device region 308, the work-function layer may include a TaN layer and a titanium aluminum (TiAl) layer over the TaN layer. For the p-type FinFET in the p-type device region 308, the work-function layer may include a TaN layer, a TiN layer over the TaN layer, and a TiAl layer over the TiN layer. After the deposition of the work-function layer(s), another barrier layer, which may be another TiN layer, is formed. The gate electrode 330 may also include a filling metal, which may be formed of tungsten or cobalt, for example. After the formation of the replacement gate stack 328, the replacement gate stack 328 is etched back, and the dielectric hard mask 334 is formed over the etched-back replacement gate stack 328.

Next, the ILD 326 and the CESL 324 are etched to form contact openings. The etching may be performed using, for example, Reactive Ion Etching (RIE). In a subsequent step, as shown in FIG. 25, source/drain contact plugs 336 are formed. Before forming the contact plugs 336, the portions of the CESL 324 exposed to the contact openings are first etched, revealing the epitaxy regions 322. The silicide regions 338 are then formed on the epitaxy regions 322. In accordance with some embodiments of the present disclosure, the contact plugs 336 include barrier layers and a metal-containing material over the respective barrier layers. In accordance with some embodiments of the present disclosure, the formation of the contact plugs 336 includes forming a blanket barrier layer and a metal-containing material over the blanket barrier layer, and performing a planarization to remove excess portions of the blanket barrier layer and the metal-containing material. The barrier layer may be formed of a metal nitride such as titanium nitride or tantalum nitride. The metal-containing material may be formed of tungsten, cobalt, copper, or the like. An n-type or a p-type FinFET 308 is thus formed.

FIGS. 26-30 illustrate perspective views and cross-sectional views of intermediate stages in the formation of Fin Field-Effect Transistors (FinFETs) which include a device region 308a, (e.g., at least one short channel FinFET) and a device region 308b (e.g., at least one long channel FinFET) in accordance with some embodiments that use the method 1000 or the method 1300 in the CMP process.

Figure 26:
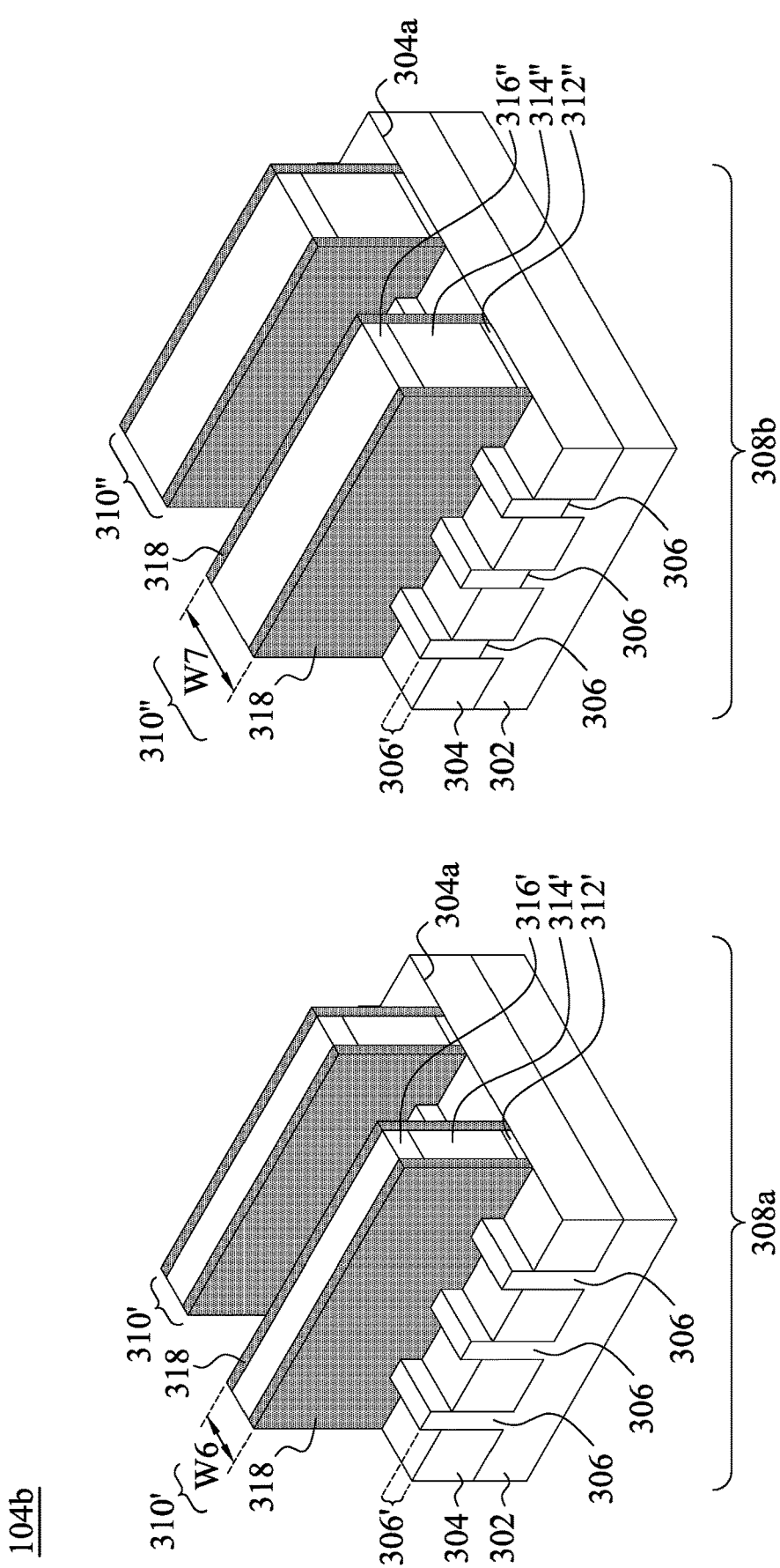
FIGS. 26-30 illustrate perspective views and cross-sectional views of intermediate stages in the formation of FinFETs in accordance with some embodiments.

FIG. 26 illustrates a perspective view of an initial structure. The initial structure includes a wafer 104b, which further includes a substrate 302 where the short channel FinFET 308a and the long channel FinFET 308b are formed. Referring to FIG. 26, the first dummy gate stacks 310' and the second dummy gate stacks 310" are formed on the top surfaces and the sidewalls of protruding fins 306'. The first dummy gate stacks 310' may include dummy gate dielectrics 312' and dummy gate electrodes 314a' over the dummy gate dielectrics 312'. The second dummy gate stacks 310" may include dummy gate dielectrics 312" and dummy gate electrodes 314" over the dummy gate dielectrics 312". A first width W6 of the first dummy gate stack 310' is smaller than a second width W7 of the second dummy gate stack 310". A lengthwise direction of the first and second dummy gate stacks 310' and 310" are perpendicular to a lengthwise direction of the protruding fins 306'. Formation of the first dummy gate stacks 310' and the second dummy gate stacks 310" is discussed previously with respect to formation of the dummy gate stacks 310 as shown in FIG. 21, and a detailed description of the same is omitted herein for the sake of brevity.

Figure 27:
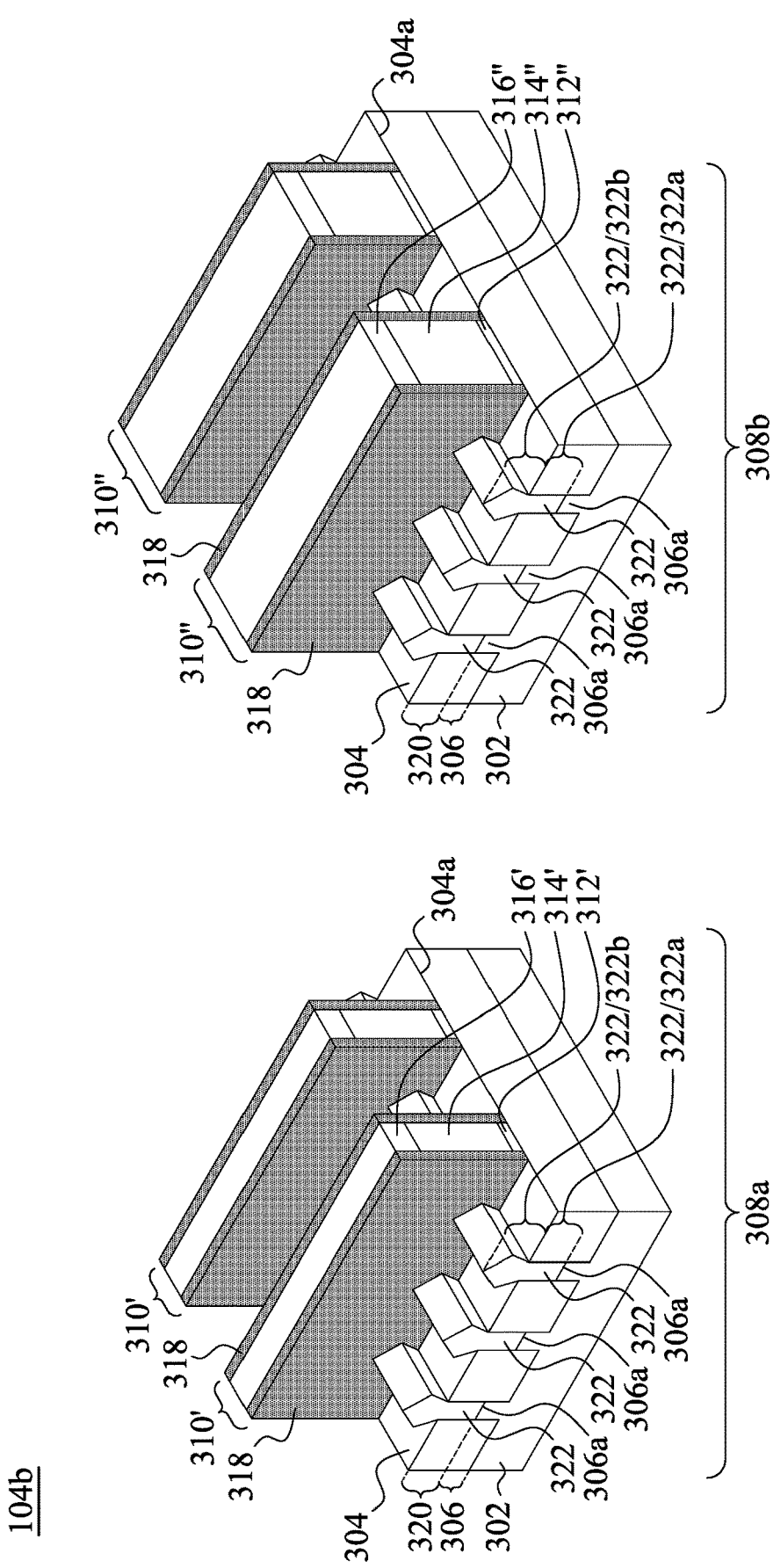
Figure 28:
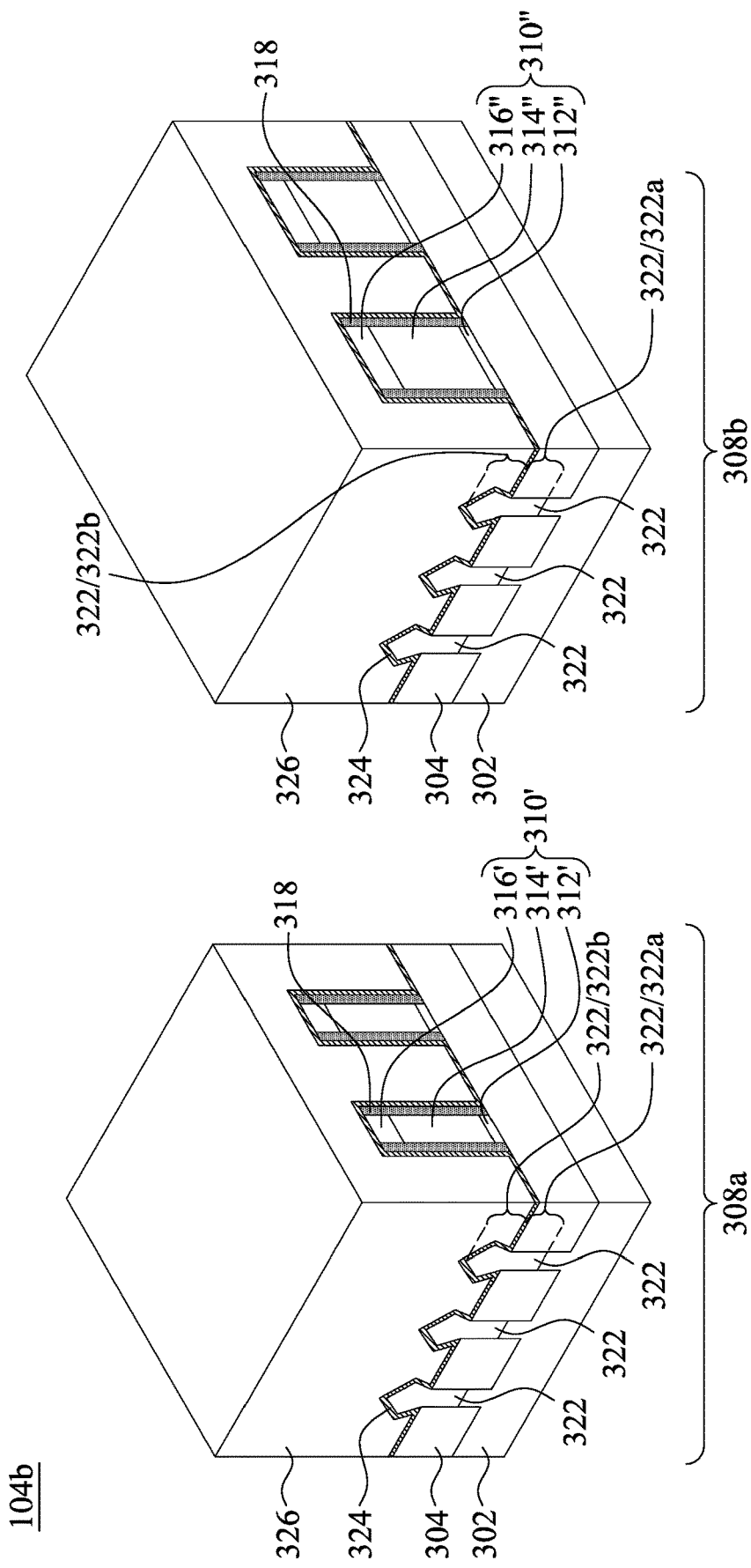

FIG. 27 illustrates an etching step (referred to as source/drain recessing hereinafter) performed to etch the portions of the protruding fins 306' that are not covered by the dummy gate stacks 310' and 310" and the gate spacers 38 and selective growth of the epitaxy regions 322a and 322b (source/drain regions) in the recesses 320. Formation of the recess 320 and the epitaxy regions 322a and 322b is discussed previously with respect to formation of the recess 320 as shown in FIG. 22, and a detailed description of the same is omitted herein for the sake of brevity.

Contact Etch Stop Layer (CESL) 324 and Inter-Layer Dielectric (ILD) 326 are then formed, as shown in FIG. 27, which illustrates a perspective view. Formation of the CESL 324 and the ILD 326 is discussed previously with respect to FIG. 22, and a detailed description of the same is omitted herein for the sake of brevity.

Figure 29A:
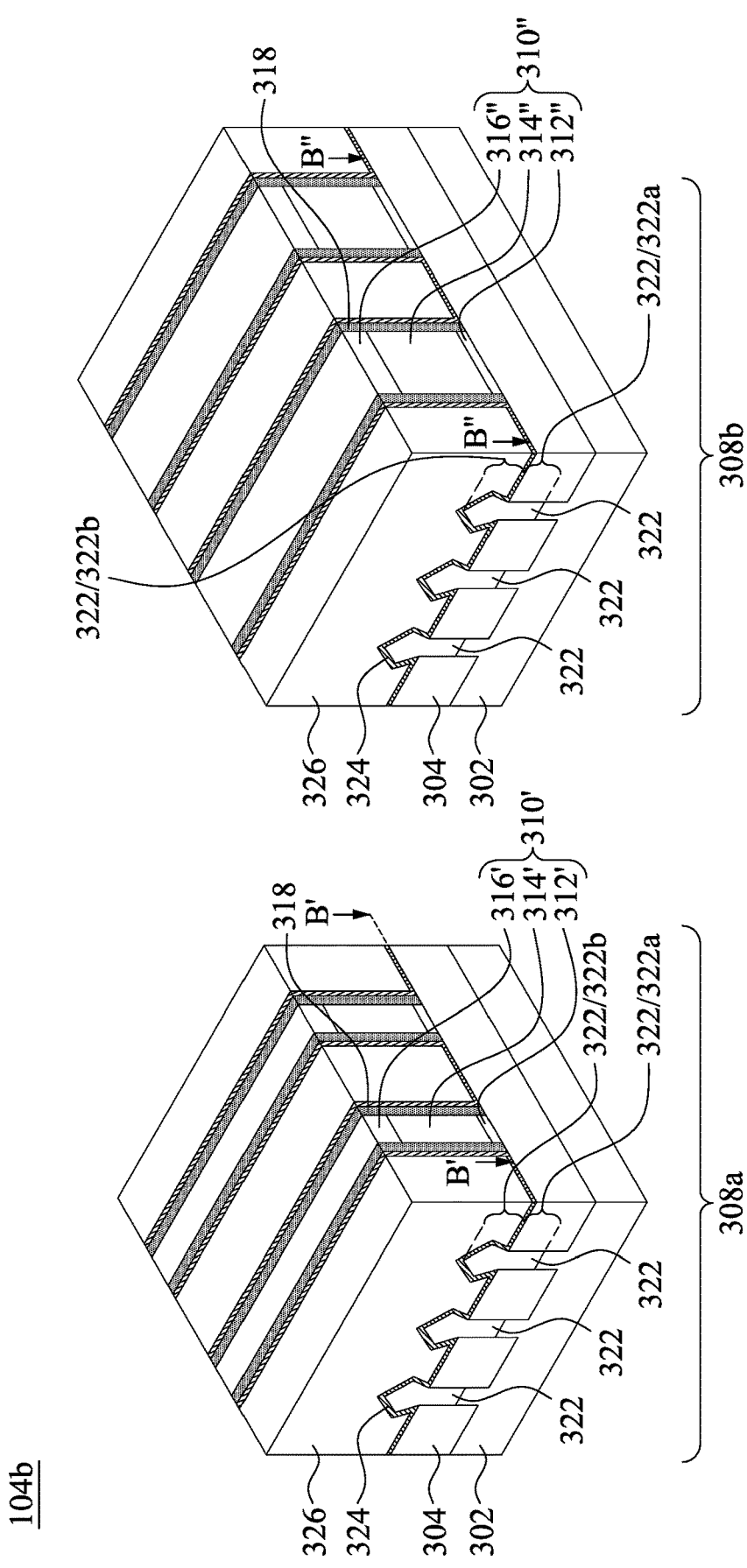
Figure 29B:
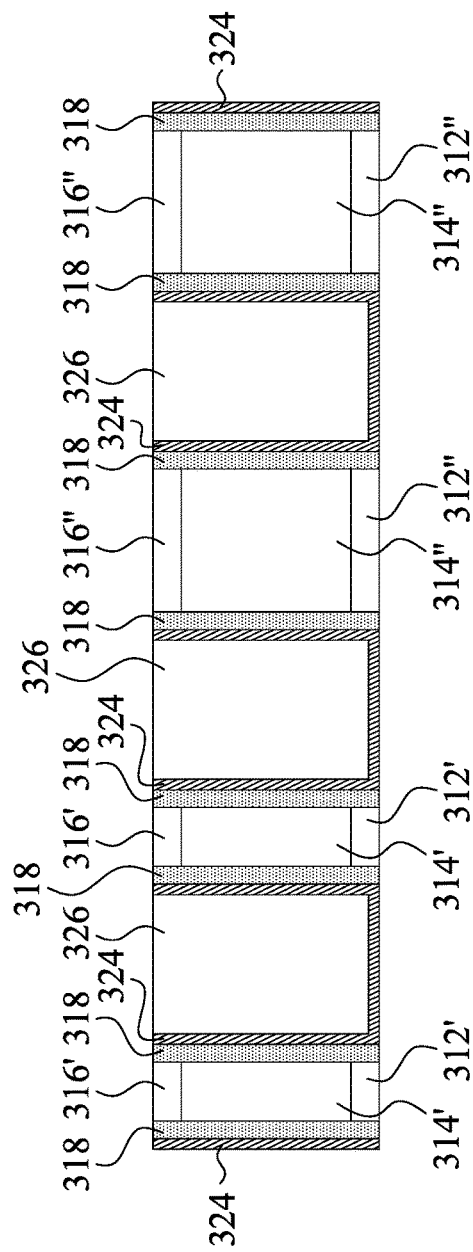
Figure 29C:
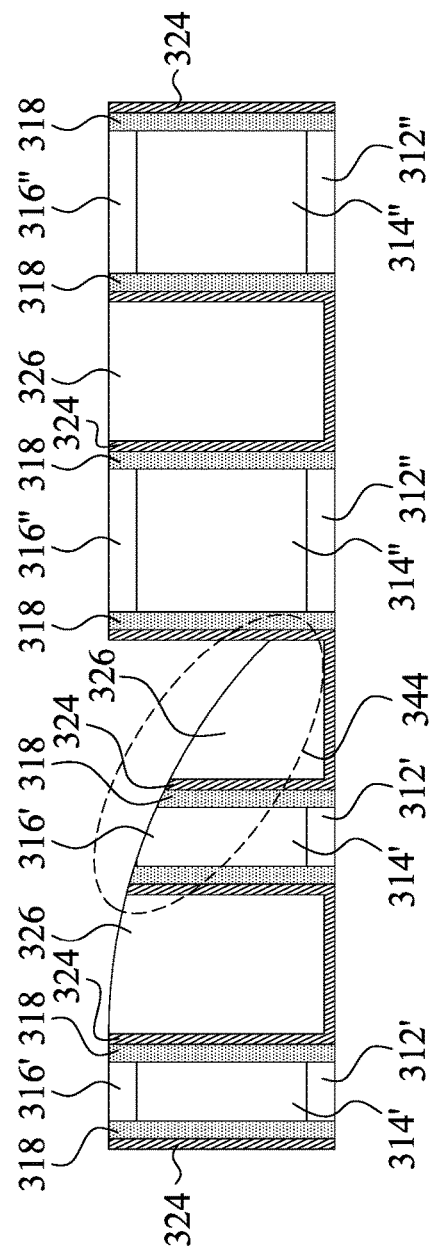
Figure 30:
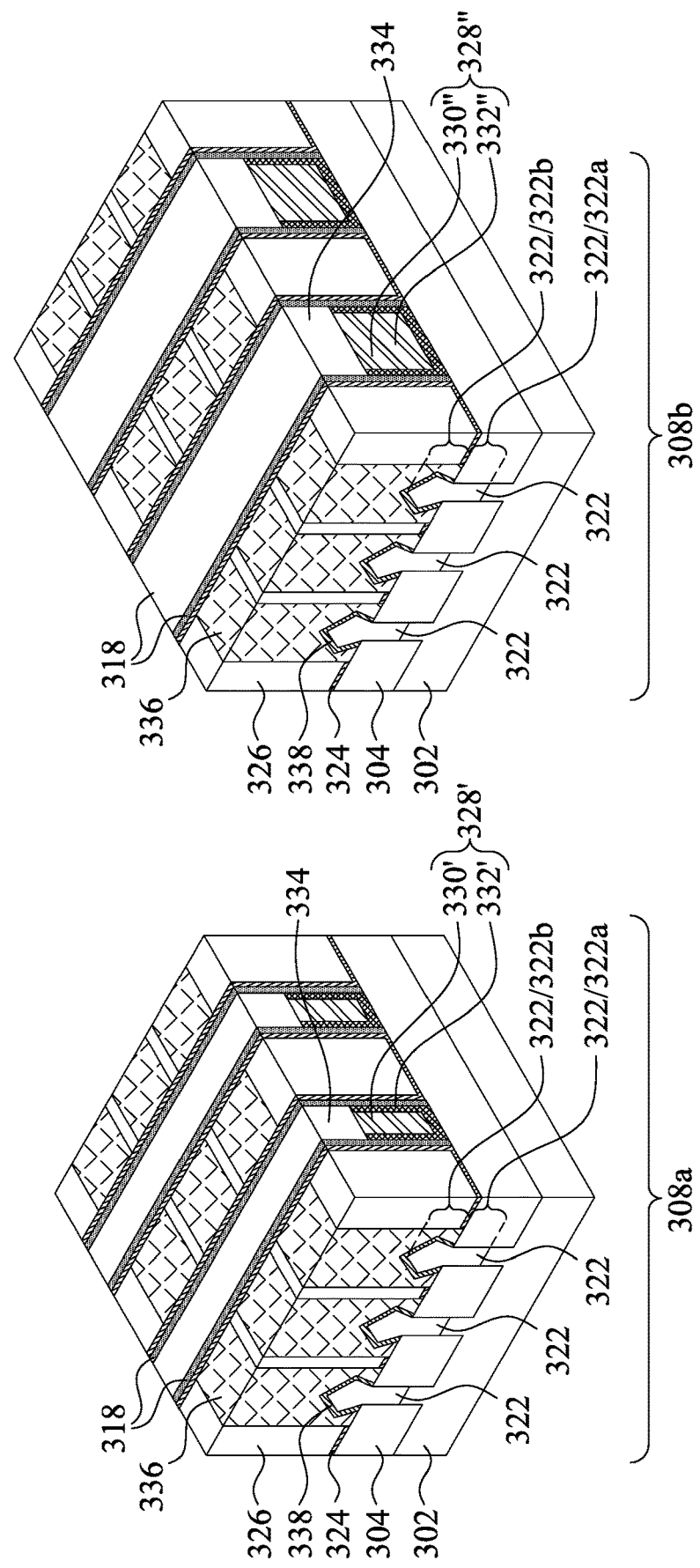

A planarization step such as Chemical Mechanical Polish (CMP) or mechanical grinding using the CMP systems 194 and 202 shown in FIG. 1 or 7 and the methods 1000 or 1300 shown in FIG. 10 or FIG. 13 may be performed to level the top surfaces of the ILD 326, the first and second dummy gate stacks 310' and 310", and the gate spacers 318 with each other, as shown in FIGS. 29A and 29B. FIGS. 29B and 29C illustrate cross-sectional views of the device regions 308a and 308b in accordance with some embodiments. The cross-sectional views combines the cross-sectional view obtained from the vertical plane containing line B'-B' in FIG. 29A and the cross-sectional view obtained from the vertical plane containing B"-B" line in FIG. 29A. If the planarization step is performed without using the method 1000 shown in FIG. 10 or the method 1300 shown in FIG. 13, some regions where features are not spaced closely together will experience a serious dishing effect (highlighted in FIG. 29C by the dashed circle labeled 344). For example, in some embodiments, the long channel device may suffer from a serious loading effect resulting from the CMP process In a subsequent step, as shown in FIG. 30, silicide region 338, replacement gate stack 328' and 328", which includes gate electrodes 330' and 330" and replacement gate dielectrics 332' and 332", and source/drain contact plugs 336 are formed. Formation of the silicide regions 338, replacement gate stack 328' and 328", which includes gate electrodes 330' and 330" and replacement gate dielectrics 332' and 332", and the source/drain contact plugs 336 is discussed previously with respect to FIG. 25, and a detailed description of the same is omitted herein for the sake of brevity.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that the polishing pad can be reconditioned in real-time during polishing the wafer without disposing the conditioning disk. Another advantage is that defects formed on the surface layer of the wafer during the polishing can be reduced by using the engraved region of the bottom portion of the retainer ring. Still yet another advantage is that production cost can be saved by using the retainer ring and the conditioning disk made of a non-diamond material.

In some embodiments, a method of using a polishing system includes securing a wafer in a carrier head, the carrier head including a housing enclosing the wafer, in which the housing includes a retainer ring recess and a retainer ring positioned in the retainer ring recess, the retainer ring surrounding the wafer, in which the retainer ring includes a main body portion and a bottom portion connected to the main body portion, and a bottom surface of the bottom portion includes at least one first engraved region and a first non-engraved region adjacent to the first engraved region; pressing the wafer against a polishing pad; and moving the carrier head or the polishing pad relative to the other.

In some embodiments, a method of conditioning a polishing pad includes providing a polishing pad; providing a slurry including abrasive particles and a chemical solution; providing a conditioning disk for conditioning a polishing pad of a chemical mechanical polishing system, in which the conditioning disk has a bottom surface comprising at least one engraved region and a non-engraved region adjacent to the engraved region, and the engraved region and the non-engraved region are made of the same material; and conditioning the polishing pad using the conditioning disk.

In some embodiments, a chemical mechanical polishing system includes a polishing pad, and a carrier head including a retainer ring to retain a wafer proximate to the polishing pad during polishing. A bottom surface of the retainer ring has a plurality of protrusions and a substantially flat region surrounding the protrusions. The protrusions and the substantially flat region are monolithic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
securing a wafer in a carrier head, the carrier head comprising:
a housing enclosing the wafer, wherein the housing includes a retainer ring recess; and
a retainer ring positioned in the retainer ring recess, the retainer ring surrounding the wafer, wherein the retainer ring includes a main body portion and a bottom portion connected to the main body portion, a bottom surface of the bottom portion comprises at least one first engraved region and a first non-engraved region adjacent to the first engraved region, and the at least one first engraved region and the first non-engraved region are at the same level height;
pressing the wafer against a polishing pad;
moving the carrier head or the polishing pad relative to the other;
providing a slurry to the polishing pad, the slurry including abrasive particles and a chemical solution;
conditioning the polishing pad using a conditioning disk; and
applying a first vacuum suction force over the polishing pad for collecting the abrasive particles through at least one first vacuum hole disposed on a second non-engraved region of a bottom surface of the conditioning disk.

2. The method of claim 1, wherein the first engraved region on the bottom portion of the retainer ring is in friction engagement with the polishing pad during moving the carrier head to condition the polishing pad.

3. The method of claim 1, wherein securing the wafer to the carrier head comprises securing the wafer to the carrier head, and the first engraved region of the retainer ring of the carrier head is made of a non-diamond material.

4. The method of claim 1, wherein securing the wafer to the carrier head comprises securing the wafer to the carrier head, and the first non-engraved region of the retainer ring of the carrier head is made of a non-diamond material.

5. The method of claim 1, wherein providing the slurry to the polishing pad is performed after securing the wafer in the carrier head.

6. The method of claim 1, wherein securing the wafer to the carrier head comprises securing the wafer to the carrier head, and the bottom portion of the carrier head comprise a plurality of grooves cut into the bottom portion to facilitate a flow of the slurry.

7. The method of claim 6, wherein securing the wafer to the carrier head comprises securing the wafer to the carrier head, and a surface of the main body portion of the carrier head exposed by the grooves of the bottom portion comprises at least one second engraved region and a third non-engraved region adjacent to the second engraved region.

8. The method of claim 1, wherein securing the wafer to the carrier head comprises securing the wafer to the carrier head, and the first engraved region of the bottom portion of the retainer ring of the carrier head comprises a plurality of protrusions and a plurality of grooves equally spaced apart from the protrusions.

9. The method of claim 8, wherein securing the wafer to the carrier head comprises securing the wafer to the carrier head, and the protrusions and the grooves of the first engraved region of the bottom portion of the retainer ring of the carrier head are one-piece formed.

10. The method of claim 1, wherein securing the wafer to the carrier head comprises securing the wafer to the carrier head having the retainer ring including the bottom portion comprising at least one second vacuum hole disposed on the bottom surface of the bottom portion of the retainer ring.

11. The method of claim 10, further comprising applying a second vacuum suction force through the second vacuum hole along a direction away from the polishing pad.

12. The method of claim 11, wherein applying the second vacuum suction force and moving the carrier head are performed substantially synchronously.

13. The method of claim 11, wherein applying the second vacuum suction force is performed after moving the carrier head.

14. The method of claim 1, wherein securing the wafer to the carrier head comprises securing the wafer to the carrier head, and the first engraved region of the bottom portion of the retainer ring of the carrier head has at least one rounded corner.

15. A method, comprising:
providing a polishing pad;
providing a slurry including abrasive particles and a chemical solution;
providing a conditioning disk for conditioning a polishing pad of a chemical mechanical polishing system, wherein the conditioning disk has a bottom surface comprising at least one engraved region and a non-engraved region adjacent to the engraved region, and the engraved region and the non-engraved region are made of the same material;
conditioning the polishing pad using the conditioning disk; and
applying a vacuum suction force over the polishing pad for collecting the abrasive particles through at least one vacuum hole disposed on the non-engraved region of the bottom surface of the conditioning disk.

16. The method of claim 15, wherein providing the conditioning disk comprising providing the conditioning disk comprising the engraved region formed using an ultra-precision machining method.

17. The method of claim 15, wherein providing the conditioning disk comprises the engraved region being sector-shaped, donut-shaped, circular-shaped, or combinations thereof.

18. A chemical mechanical polishing system, comprising:
a polishing pad;
a carrier head including a retainer ring to retain a wafer proximate to the polishing pad during polishing, wherein a bottom surface of the retainer ring has a plurality of protrusions and a substantially flat region surrounding the protrusions, and the protrusions and the substantially flat region are monolithic, and the protrusions and the substantially flat region are at the same level height; and
a conditioning disk over the polishing pad, wherein the conditioning disk comprises at least one vacuum hole disposed on a non-engraved region of a bottom surface of the conditioning disk.

19. The system of claim 18,
wherein the bottom surface of the conditioning disk comprises a plurality of protrusions made of a non-diamond material.

20. The system of claim 19, wherein the conditioning disk comprises an engraved region having a distribution being a donut-shaped including a ring-shaped portion that encloses a circular shape portion.

* * * * *